United States Patent
Nelson et al.

(10) Patent No.: US 9,142,647 B1
(45) Date of Patent: Sep. 22, 2015

(54) VTFT FORMATION USING SELECTIVE AREA DEPOSITION

(71) Applicants: Shelby Forrester Nelson, Pittsford, NY (US); Carolyn Rae Ellinger, Rochester, NY (US)

(72) Inventors: Shelby Forrester Nelson, Pittsford, NY (US); Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 29 days.

(21) Appl. No.: 14/198,636

(22) Filed: Mar. 6, 2014

(51) Int. Cl.
*H01L 21/44* (2006.01)
*H01L 29/66* (2006.01)
*H01L 21/28* (2006.01)

(52) U.S. Cl.
CPC .... *H01L 29/66742* (2013.01); *H01L 21/28008* (2013.01); *H01L 29/66666* (2013.01)

(58) Field of Classification Search
CPC .................. H01L 21/823885; H01L 29/41741
USPC .......................................... 438/666, 674, 677
See application file for complete search history.

(56) References Cited

U.S. PATENT DOCUMENTS

| | | | |
|---|---|---|---|
| 7,160,819 B2 | 1/2007 | Conley et al. | |
| 7,413,982 B2 | 8/2008 | Levy | |
| 7,456,429 B2 | 11/2008 | Levy | |
| 7,572,686 B2 | 8/2009 | Levy et al. | |
| 7,789,961 B2 | 9/2010 | Nelson et al. | |
| 7,998,878 B2* | 8/2011 | Levy et al. ................... | 438/765 |
| 8,017,183 B2 | 9/2011 | Yang et al. | |
| 8,273,654 B1* | 9/2012 | Nelson et al. ................ | 438/627 |
| 2005/0084610 A1 | 4/2005 | Selitser | |
| 2005/0164464 A1* | 7/2005 | Hecht et al. ................... | 438/386 |
| 2006/0213957 A1 | 9/2006 | Addington et al. | |
| 2008/0166880 A1 | 7/2008 | Levy | |
| 2009/0051749 A1 | 2/2009 | Baker | |
| 2009/0078204 A1 | 3/2009 | Kerr et al. | |

(Continued)

FOREIGN PATENT DOCUMENTS

| | | |
|---|---|---|
| JP | 60-160169 | 8/1985 |
| JP | 08-148685 | 6/1996 |

(Continued)

OTHER PUBLICATIONS

Sinha, A. et al., "Area Selective Atomic Layer Deposition of Titanium Dioxide: Effect of Precursor Chemistry", J. Vac. Sci. Technol. B 24(6), pp. 2523-2532, Nov./Dec. 2006.

(Continued)

*Primary Examiner* — Karen Kusumakar
(74) *Attorney, Agent, or Firm* — William R. Zimmerli

(57) ABSTRACT

A method of producing a vertical transistor includes providing a conductive gate structure having a reentrant profile on a substrate. A conformal insulating material layer is formed on the conductive gate structure. A conformal semiconductor material layer is formed on the insulating material layer. A deposition inhibiting material is deposited over a portion of the substrate and the conductive gate structure including filling the reentrant profile. A portion of the deposition inhibiting material is removed without removing all of the deposition inhibiting material from the reentrant profile. A plurality of electrodes is formed by depositing an electrically conductive material layer on portions of the semiconductor material layer using a selective area deposition process in which the electrically conductive material layer is not deposited on the deposition inhibiting material remaining in the reentrant profile.

11 Claims, 21 Drawing Sheets

(56) References Cited

U.S. PATENT DOCUMENTS

| | | |
|---|---|---|
| 2009/0081366 A1 | 3/2009 | Kerr et al. |
| 2009/0081827 A1 | 3/2009 | Yang et al. |
| 2009/0130858 A1 | 5/2009 | Levy |
| 2013/0052832 A1* | 2/2013 | Nelson et al. ............. 438/703 |

FOREIGN PATENT DOCUMENTS

| | | |
|---|---|---|
| JP | 2008-277375 | 11/2008 |
| JP | 2010-192477 | 9/2010 |
| WO | 2007/086237 | 8/2007 |
| WO | WO 2008/082472 | 7/2008 |

OTHER PUBLICATIONS

Sinha, A. et al., "A Top Surface Imaging Method Using Area Selective ALD on Chemically Amplified Polymer Photoresist Films", Electrochemical and Solid-State Letters, 9 (11), pp. G330-G333 (2006).

* cited by examiner

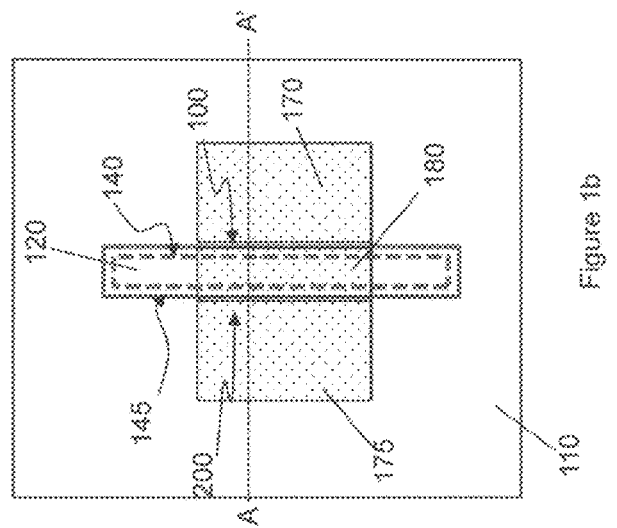
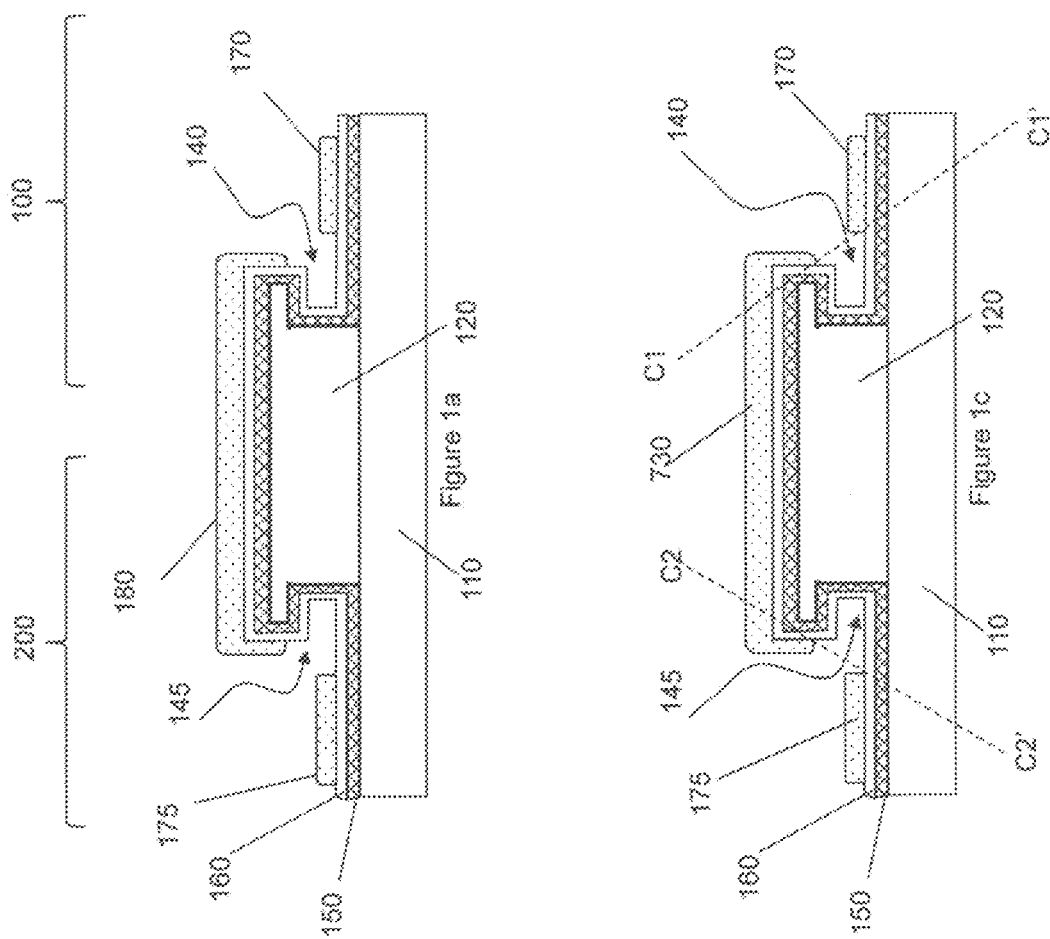

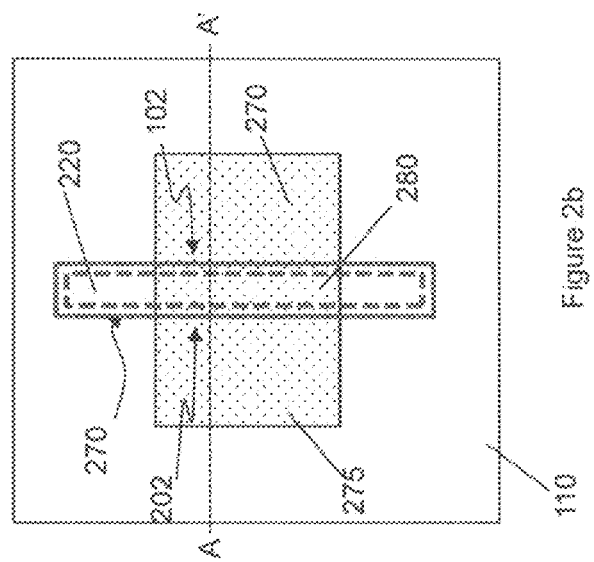
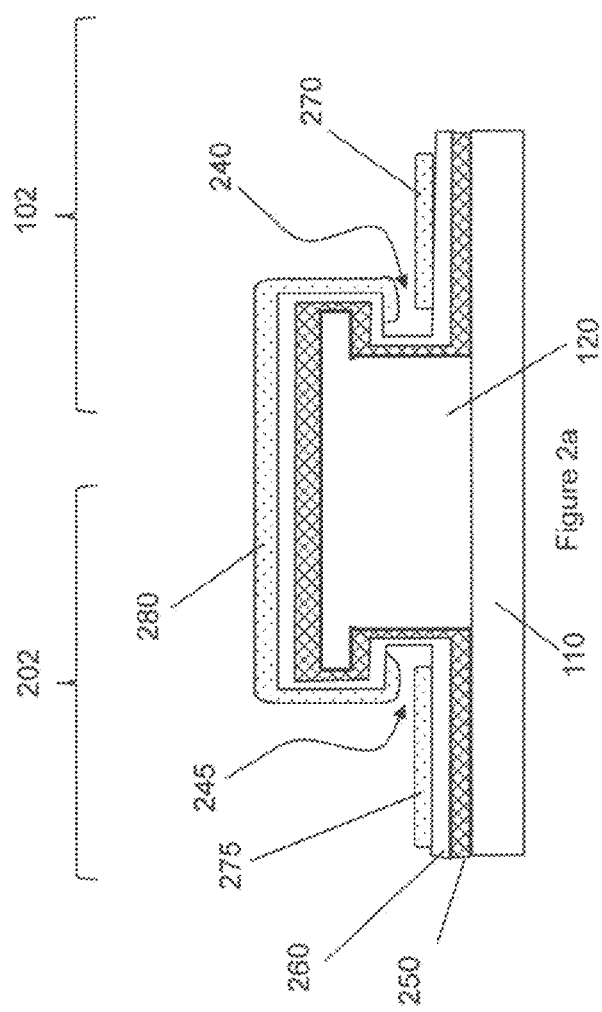

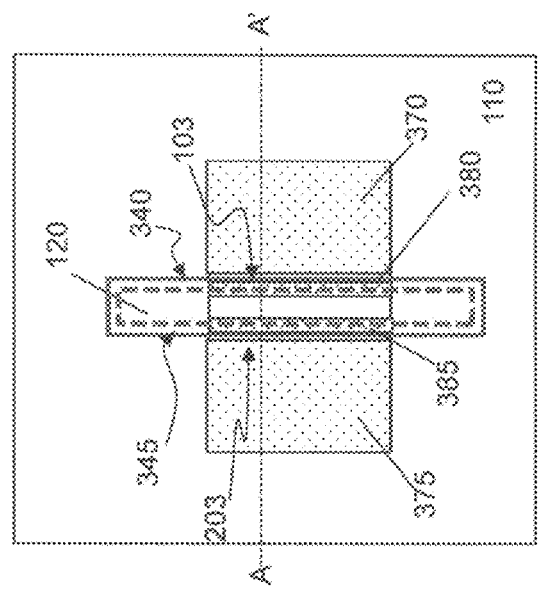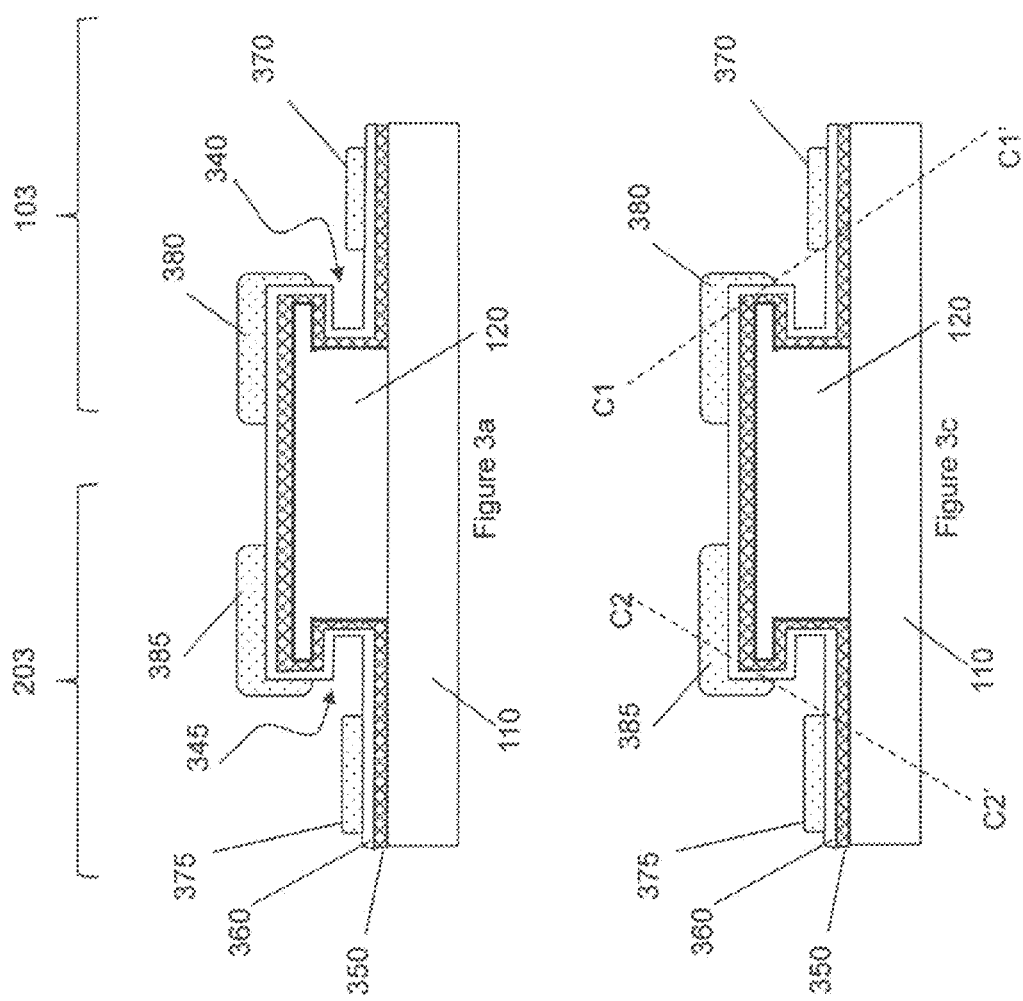

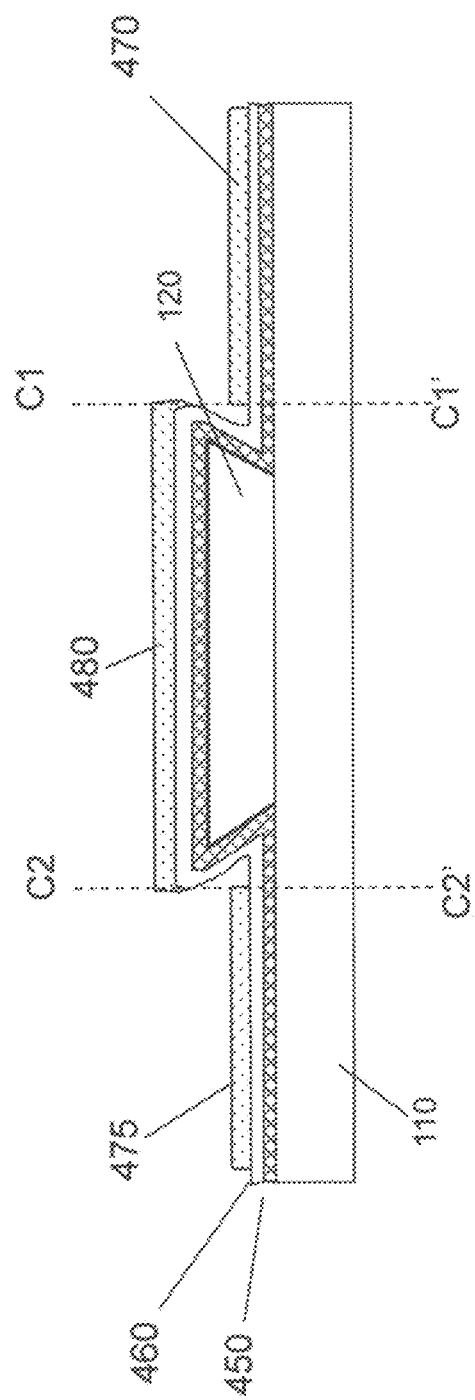

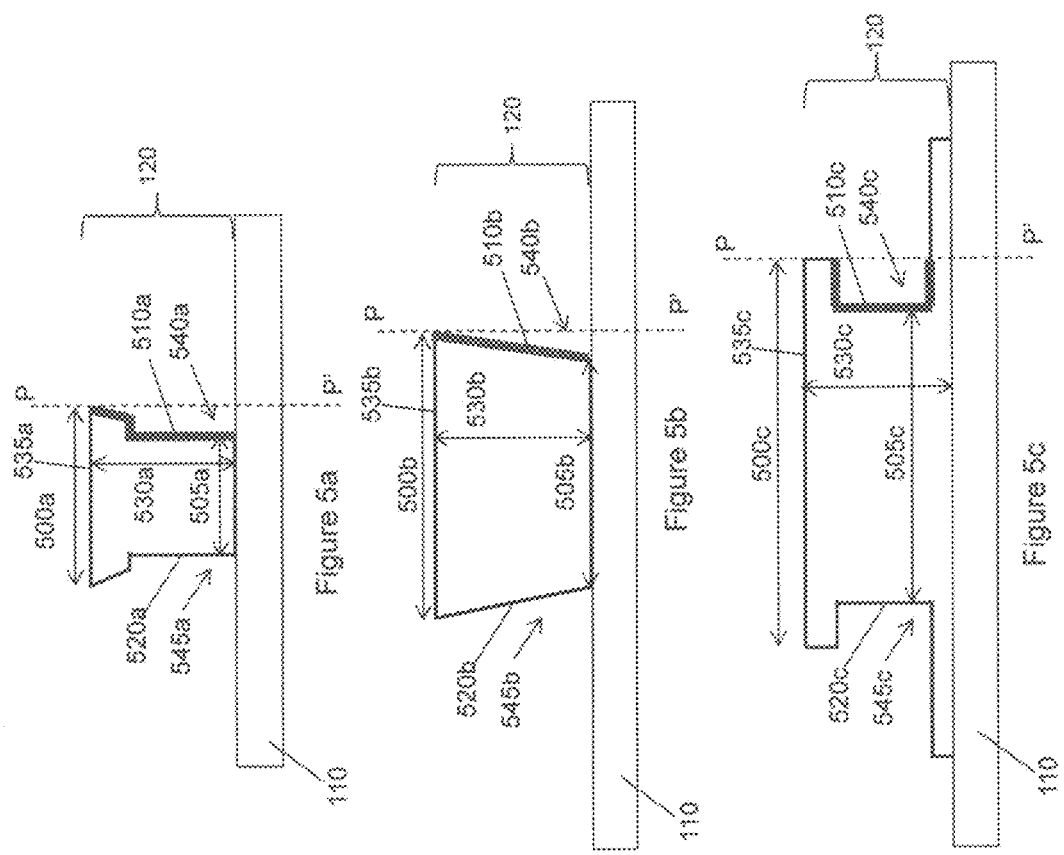

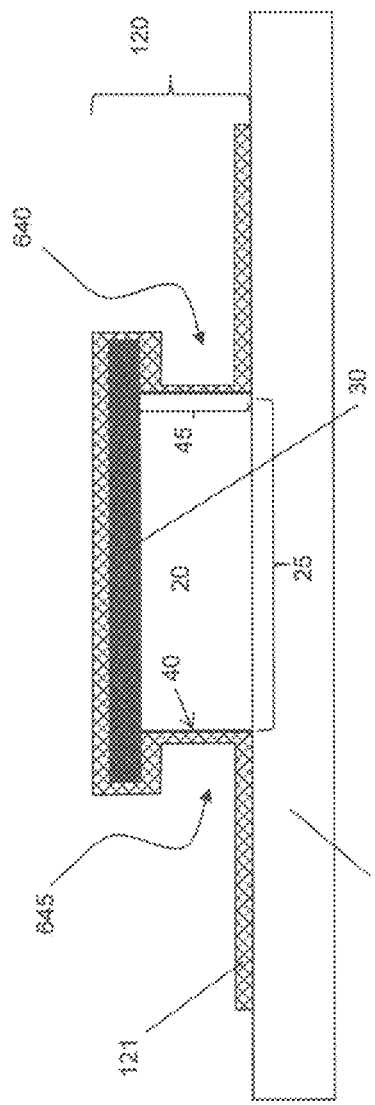
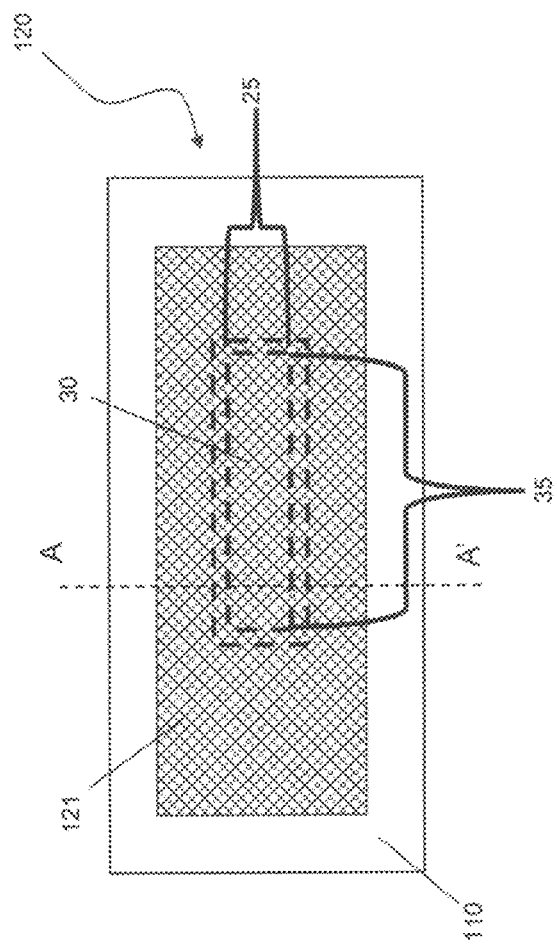
Figure 6a
Figure 6b

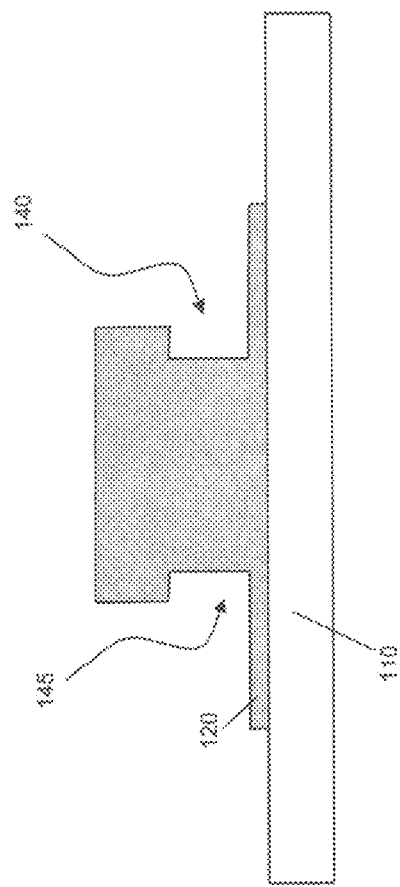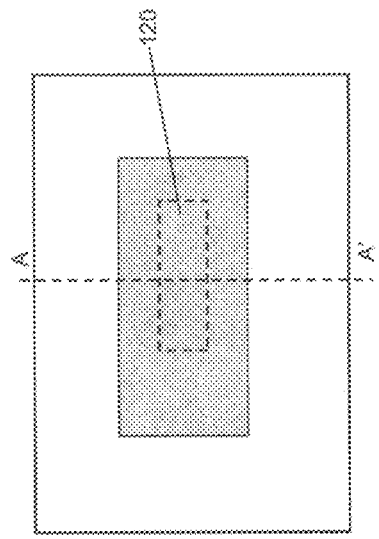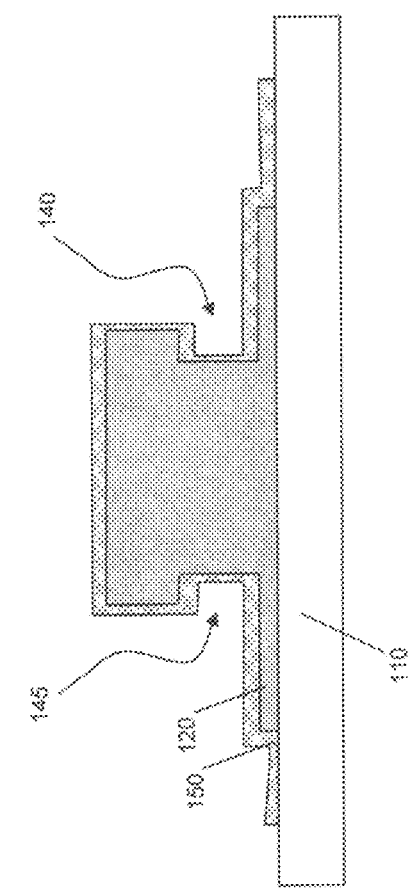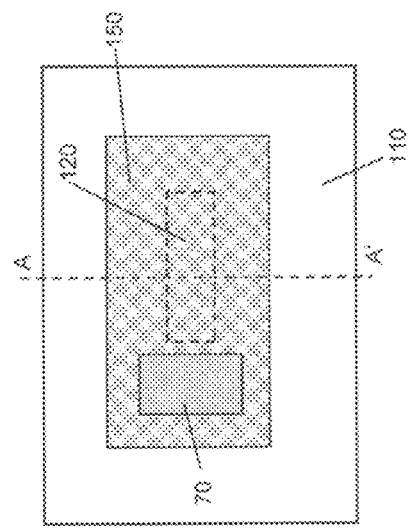

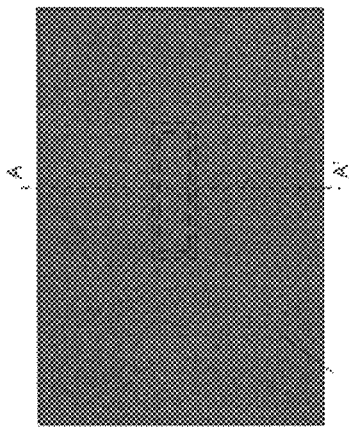
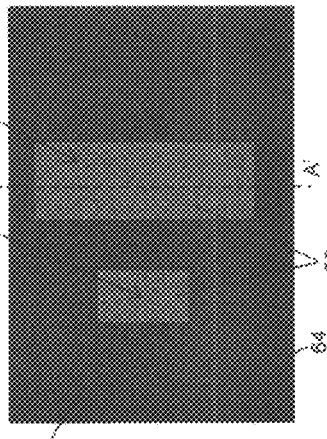
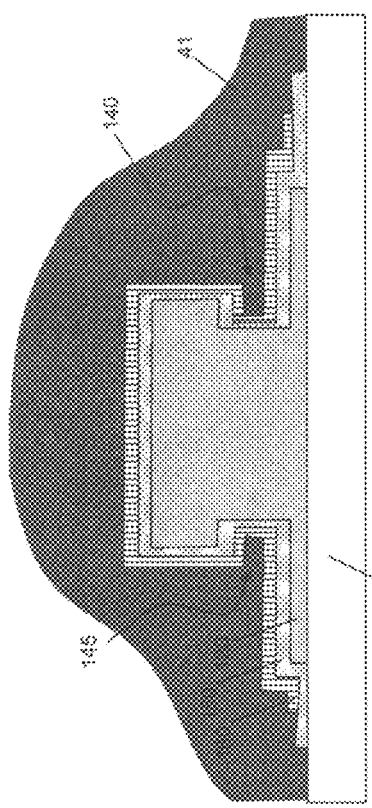
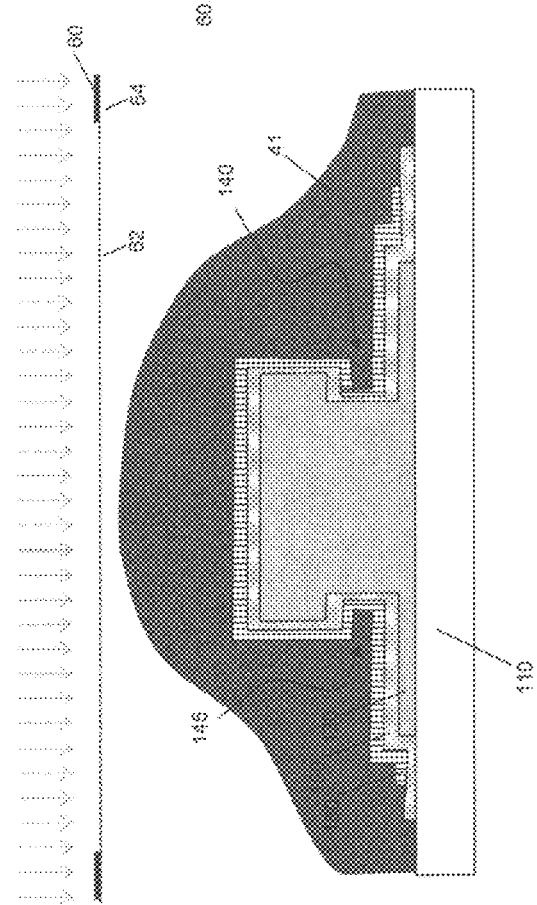

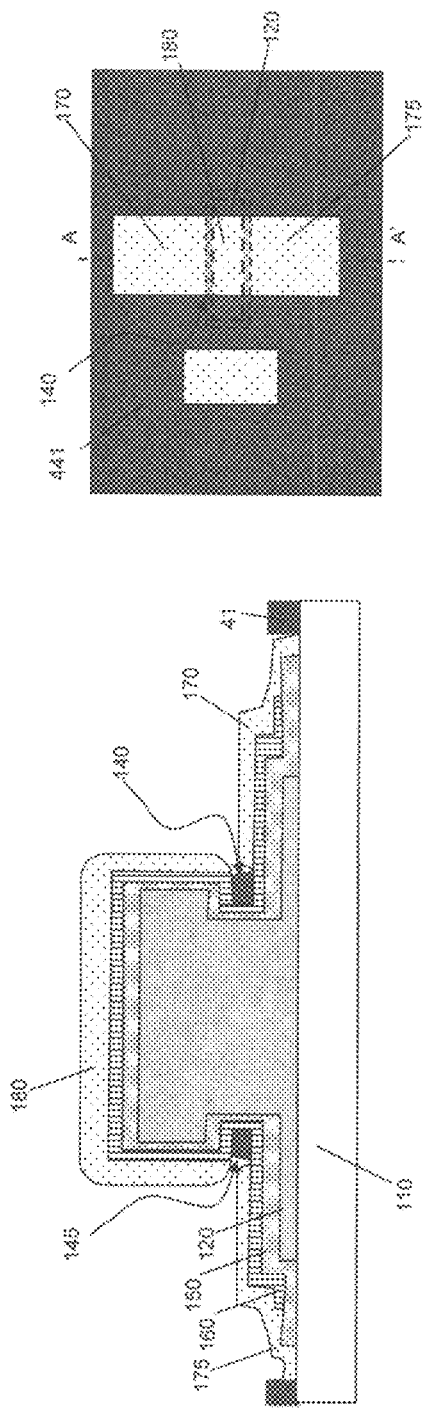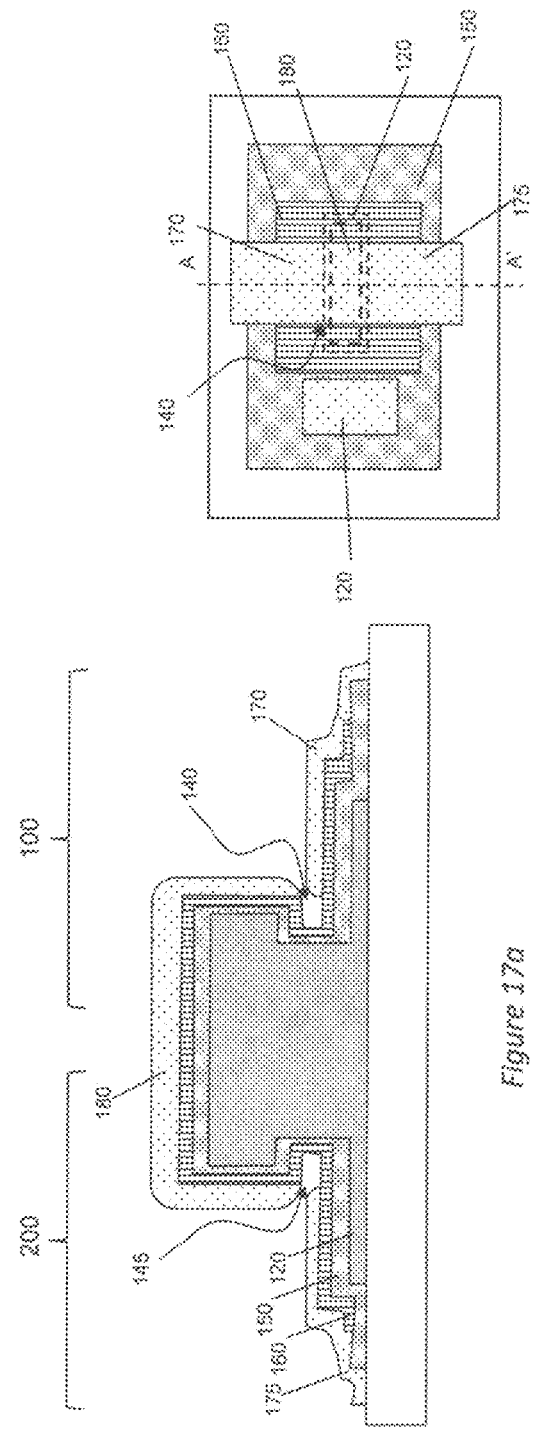

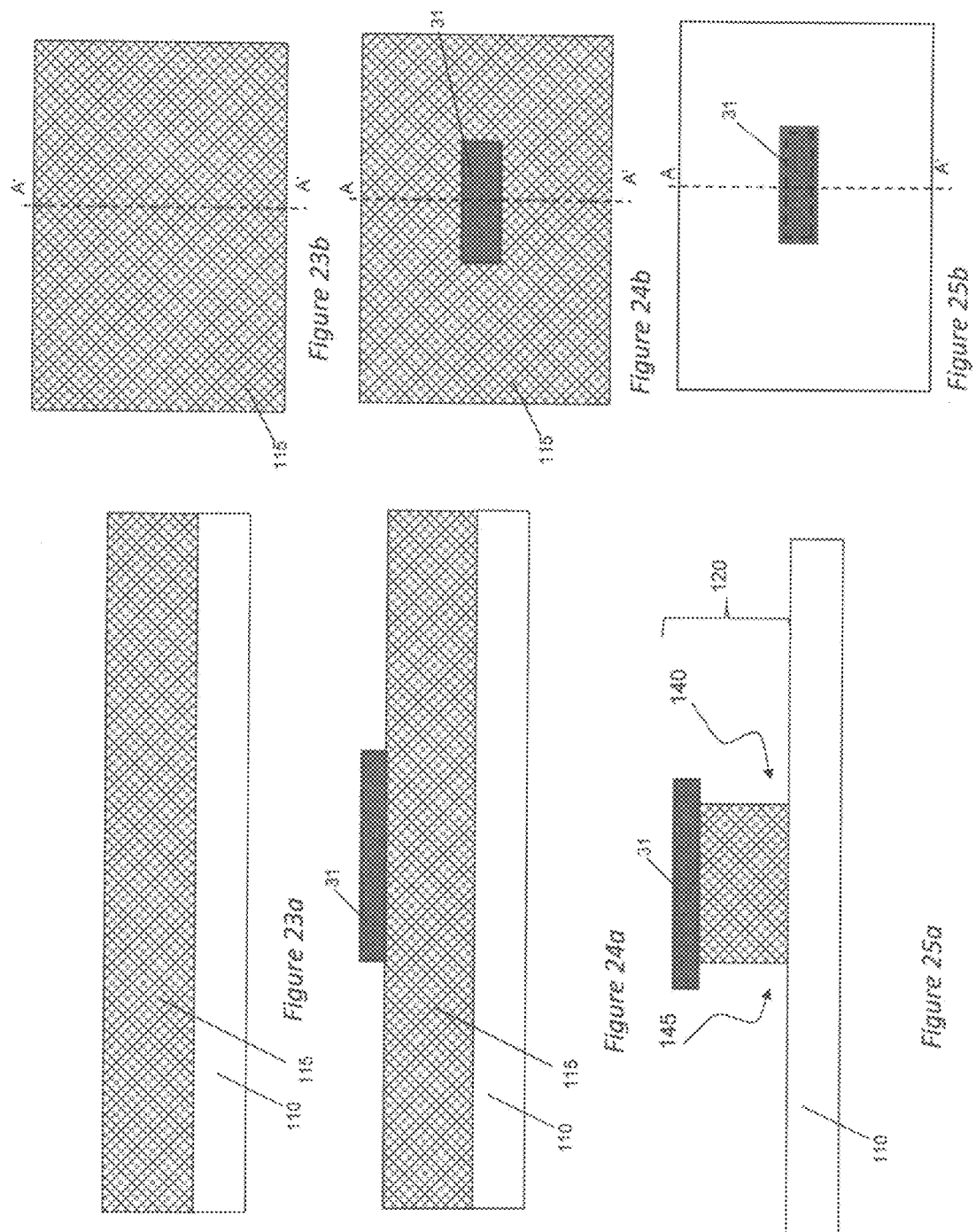

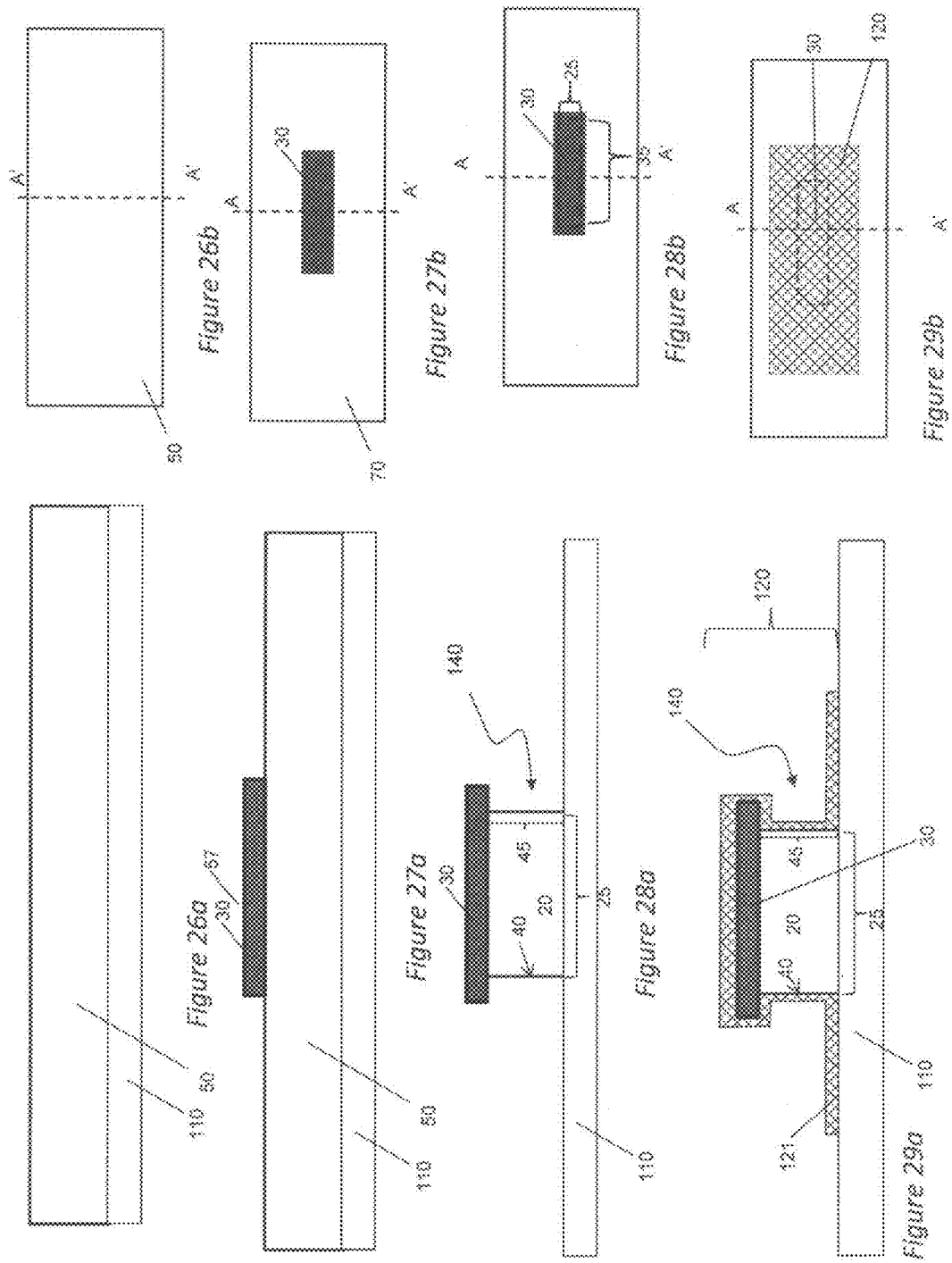

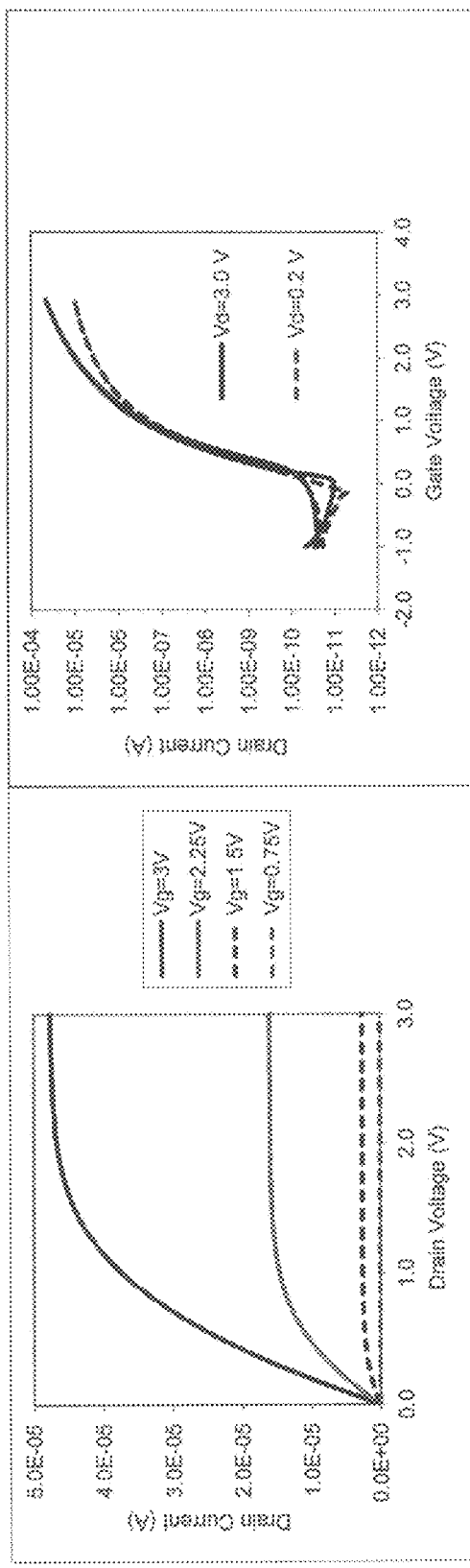

VTFT FORMATION USING SELECTIVE AREA DEPOSITION

CROSS REFERENCE TO RELATED APPLICATIONS

Reference is made to commonly-assigned, U.S. patent application Ser. No. 14/198,621, entitled "VTFT FORMATION USING CAPILLARY ACTION", Ser. No. 14/198,643, entitled "VTFT INCLUDING OVERLAPPING ELECTRODES", Ser. No. 14/198,623, entitled "VTFTS INCLUDING OFFSET ELECTRODES", Ser. No. 14/198,626, entitled "PATTERNING A STRUCTURAL POLYMER PATTERNING", all filed concurrently herewith.

FIELD OF THE INVENTION

This invention relates generally to semiconductor devices and in particular to transistor devices.

BACKGROUND OF THE INVENTION

Modern-day electronics systems typically require multiple patterned layers of electrically or optically active materials, sometimes over a relatively large substrate. Electronics such as radio frequency identification (RFID) tags, photovoltaics, optical sensors, or chemical sensors all require some level of patterning in their electronic circuitry. Flat panel displays, such as liquid crystal displays or electroluminescent displays, typically rely upon accurately patterned sequential layers to form thin film electronic components of a backplane. These electronic components include capacitors, transistors, or power buses. The usual combination of photolithographic patterning methods and selective etch processes has several shortcomings including high cost, difficulty with large substrates, or complexity of selective etch processes.

Feature sizes obtainable using traditional processing methods are limited by the resolution of the photolithography tools. Currently, a minimum feature size for large area display backplanes is around 0.5 microns and requires expensive high end equipment to obtain. Minimum feature sizes for large area substrates using less expensive equipment are usually much larger. High speed circuit operation requires TFTs with high drive current, and many applications also require the drive current be obtained with low voltage operation. It is well known that TFT performance is improved by reducing channel length. In order to move beyond the exposure limitation of feature size, vertical transistors of various architectures are currently being studied. In a vertical TFT architecture, a channel is formed perpendicular to the substrate, and therefore the channel length (L) can be controlled by the height of a layer in the transistor.

Recent work in the fabrication of VTFT, while yielding short channel length devices, uses otherwise standard photolithographic techniques with complex semiconductor processes. For example, since it is not currently possible to put patterns directly on walls which are vertical with respect to a substrate surface, vertical wall patterning has been accomplished using a suitable filler material to partially fill in a trench. The filler material acts as a mask for the portions of the wall located underneath while allowing for processing of the walls above the filler material. This has been used, for example, when an oxide is to be deposited exclusively on vertical walls below a filler material. The oxide is first deposited or produced over the entire surface of the relief. The relief, or trench, is initially completely filled with a suitable filler material. Then, the filler material is recessed back to a depth that just covers the desired oxide. After uncovered sections of the oxide are removed, the remaining filler material is removed.

Alternatively, when it is necessary that an oxide be deposited or produced only in upper regions of a vertical wall, an etching stop layer, for example, a nitride layer, is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

Accordingly, there is an ongoing need to provide semiconductor device architectures that include patterned vertical or inclined device surfaces. There is also an ongoing need to provide simple manufacturing techniques capable of processing small device features of semiconductor devices without requiring high resolution alignments and small gap printing for vertical TFTs. There is also an ongoing need to provide higher current semiconductor devices by improving the series resistance of the device.

In order to maintain acceptable device performance when shrinking the size of a TFT channel, it is typical to scale the layer thicknesses with the size of the device. For example, conventional CMOS production with channel lengths of 90 nm and lower often utilizes dielectric layer thicknesses of less than 10 nm. While there are many processes to deposit dielectric materials, few result in quality films at these thicknesses.

Atomic layer deposition (ALD) is a process that is both conformal and known to result in high quality thin layers when used with optimized process conditions. In ALD processes, typically, two molecular precursors are introduced into the ALD reactor in separate stages. U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track. A spatially dependent ALD process can be accomplished using one or more of the systems or methods described in more detail in WO 2008/082472 (Cok), U.S. Patent Application Publications 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,789,961 (Nelson et al.), U.S. Pat. No. 7,572,686 (Levy et al.), the disclosures of which are hereby incorporated by reference in their entirety.

There is growing interest in combining ALD with a technology known as selective area deposition (SAD). As the name implies, selective area deposition involves treating a portion(s) of a substrate such that a material is deposited only in those areas that are desired, or selected. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or modified in such a way that the film is deposited only on the activated areas. There are many potential advantages to selective area deposition techniques, such as eliminating an etch process for film patterning, reduction in the number of cleaning steps required, or patterning of materials which are difficult to etch. One approach to combining patterning and depositing the semiconductor is shown in U.S. Pat. No. 7,160,819 entitled "METHOD TO PERFORM SELECTIVE ATOMIC LAYER DEPOSTION OF ZINC OXIDE" by Conley et al. Conley et al. discuss materials for use in patterning zinc oxide on silicon wafers. No information is provided, however, on the use of other substrates, or results for other metal oxides.

SAD work to date has focused on the problem of patterning a single material during deposition. There persists a problem of combining multiple SAD steps to form working devices. Processes for building complete devices should be able to control the properties of critical interfaces, particularly in field effect devices like TFTs. There remains a need for processes to simplify the manufacture of vertical TFTs, as well as a need for processes that use SAD and digital patterning processes to pattern devices which have critical vertical features, such as VTFTs. There is also an ongoing need to provide manufacturing techniques that allow the same equipment to deposit multiple, and in some cases all, of the layers making up the electrical components including, for example, conductive layers, insulating layers, or semiconductor layers.

SUMMARY OF THE INVENTION

According to an aspect of the invention, a method of producing a vertical transistor includes providing a substrate and a conductive gate structure having a reentrant profile on the substrate. A conformal insulating material layer is formed on the conductive gate structure. A conformal semiconductor material layer is formed on the insulating material layer over the conductive gate structure. A deposition inhibiting material is deposited over a portion of the substrate and the conductive gate structure and fills the reentrant profile. After depositing the inhibitor, a portion of the deposition inhibiting material is removed without removing all of the deposition inhibiting material from the reentrant profile. A plurality of electrodes are formed by depositing an electrically conductive material layer on portions of the semiconductor material layer using a selective area deposition process in which the electrically conductive material layer is not deposited on the deposition inhibiting material remaining in the reentrant profile.

BRIEF DESCRIPTION OF THE DRAWINGS

In the detailed description of the example embodiments of the invention presented below, reference is made to the accompanying drawings, in which:

FIGS. 1a-1c are schematic views of an example embodiment of vertical transistors of the present invention with FIGS. 1a and 1c being schematic cross sectional side views of the schematic plan view shown in FIG. 1b;

FIGS. 2a and 2b are schematic views of another example embodiment of vertical transistors of the present invention with FIG. 2a being a schematic cross sectional side view of the schematic plan view shown in FIG. 2b;

FIGS. 3a-3c are schematic views of an example embodiment of vertical transistors of the present invention with FIGS. 3a and 3c being schematic cross sectional side views of the schematic plan view shown in FIG. 3b;

FIG. 4 is a schematic cross-sectional side view of a conventional vertical transistor;

FIGS. 5a-5c are schematic cross-sectional side views of alternative example embodiments of gate structures of the present invention having reentrant profiles;

FIGS. 6a and 6b are a schematic cross-sectional view and a plan view, respectively, of another alternative example embodiment of a gate structure of the present invention having reentrant profiles;

FIGS. 10a and 10b through FIGS. 17a and 17b are schematic cross-sectional views and schematic plan views, respectively, showing vertical transistor formation using the process flow described in FIG. 7;

FIGS. 21a and 21b through FIGS. 22a and 22b are schematic cross-sectional views and schematic plan views, respectively, showing deposition inhibitor removal during vertical transistor formation using the process flow described in FIG. 8;

FIGS. 23a and 23b through FIGS. 25a and 25b are schematic cross-sectional views and schematic plan views, respectively, showing providing a conductive gate structure using the process flow described in FIG. 9a;

FIGS. 26a and 26b through FIGS. 29a and 29b are schematic cross-sectional views and schematic plan views, respectively, showing providing a conductive gate structure using the process flow detailed in FIG. 9b;

FIG. 32 is a graph showing performance $I_{ds}$-$V_d$ curve characteristics for the transistor of Inventive Example I2; and FIG. 33 is a graph showing performance $I_{ds}$-$V_g$ curve characteristics for the transistor of Inventive Example I2.

DETAILED DESCRIPTION OF THE INVENTION

Figure 7:
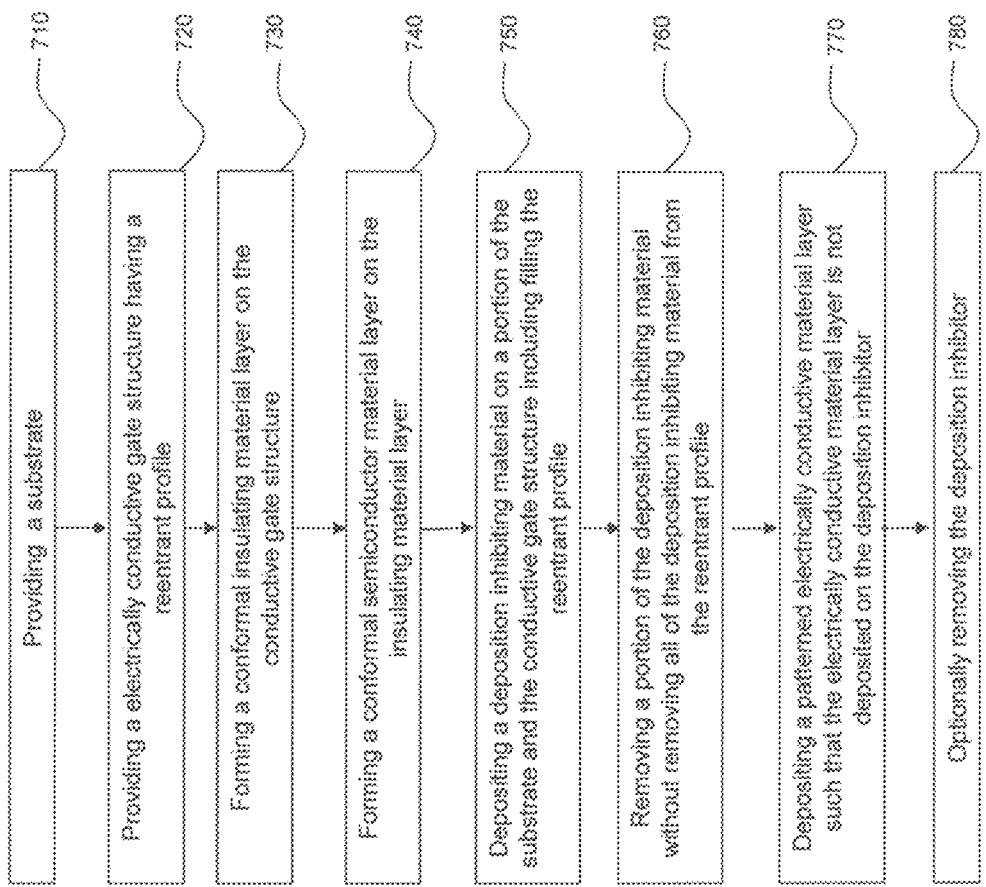
FIG. 7 is a flow chart describing an example embodiment of a process for forming a vertical thin film transistor using SAD in accordance with the present invention.

The present description will be directed in particular to elements forming part of, or cooperating directly with, vertical transistors in accordance with the present invention. It is to be understood that elements not specifically shown or described may take various forms well known to those skilled in the art. In the following description and drawings, identical reference numerals have been used, where possible, to designate identical elements.

For the description that follows, the term "gas" or "gaseous material" is used in a broad sense to encompass any of a range of vaporized or gaseous elements, compounds, or materials. Other terms used herein, including, for example, "reactant," "precursor," "vacuum," or "inert gas", all have their conventional meanings as would be well understood by those skilled in the materials deposition art. The term "over" refers to the relative position of an element to another and is insensitive to orientation, such that if one element is over another element, it is still functionally over if the entire stack is flipped upside down. The terms "over," "under," or "on" are functionally equivalent and do not require the elements to be in contact with another element, and additionally do not prohibit the existence of intervening layers within a structure. The term "adjacent" is used herein in a broad sense to mean an element next to or adjoining another element.

The figures provided are not drawn to scale but are intended to show overall function and the structural arrangement of some embodiments of the present invention. The example embodiments of the present invention are illustrated schematically and not to scale for the sake of clarity. One of ordinary skill in the art will be able to readily determine the specific size and interconnections of the elements of the example embodiments of the present invention.

The example embodiments of the present invention all relate to thin film inorganic materials and devices that contain them. The example embodiments of the present invention use selective area deposition (SAD) in combination with atomic layer deposition (ALD) for some of the fabrication steps. SAD employs a patterned material referred to as a "deposition inhibitor material," "deposition inhibiting material," "inhibitor ink," or, simply, an "inhibitor" that inhibits the growth of a thin film material on the substrate when the substrate is subjected to an atomic layer deposition. By inhibiting the growth where the deposition material is present, the deposition only deposits in regions (selective areas) of the substrate where the inhibitor is not present. The phrase "deposition inhibitor material" and its equivalents refer herein to any material on the substrate that inhibits the deposition of material during ALD. The "deposition inhibitor material" includes the material applied to the substrate as well as the material resulting from any optionally subsequent crosslinking or other reaction that modifies the material that can occur prior to depositing an inorganic thin film on the substrate by atomic layer deposition. A polymeric deposition inhibitor material can be crosslinked after applying the polymer onto the substrate, before or during the pattering step.

Two suitable approaches to combining patterning with the conformal deposition by ALD or SALD are described in US Patent Application Publication No. 2009/0081827 A1, published to Yang et al., on Mar. 26, 2009, the disclosure of which is hereby incorporated by reference in its entirety; and U.S. Pat. No. 8,017,183 B2, issued to Yang et al., on Sep. 13, 2011, the disclosure of which is hereby incorporated by reference in its entirety. Given that the preferred subsequent layers are deposited and conformally coated by atomic layer deposition (ALD), preferred deposition inhibitor materials are described in U.S. Pat. No. 7,998,878 B2, issued to Levy et al., on Aug. 16, 2011, the disclosure of which is hereby incorporated by reference in its entirety.

In some example embodiments of the present invention, a structural polymer is used. The phrase "structural polymer" as used herein refers to the polymeric material used in the formation of the polymer post and is additionally useful to distinguish the structural polymer material from other polymeric materials or polymer layers that may be used in the process.

The structural polymer is a polymer that is stable in the final application, and a wide variety of structural polymers may be used. Example structural polymers include polyesters, polyetheresters, polyamides, polyesteramides, polyurethanes, polyimides, polyetherimides, polyureas, polyamideimides, polyphenyleneoxides, phenoxy resins, epoxy resins, polyolefins, polyacrylates, polyethylene-co-vinyl alcohols (EVOH), and the like or their combinations and blends. The preferred structural polymers are epoxy resins and polyimides. The structural polymer can be a thermoplastic polymer.

The polymer can be a curable composition, either a thermal or radiation curable composition. The polymer does not need to be radiation curable or photosensitive, but photosensitive formulations are useful in the present invention so long as the final cured polymer layer has the structural and mechanical properties required in the final application. Polyimide is a preferred structural polymer due to the combination of film properties such as low stress, low CTE, low moisture uptake, high modulus, or good ductility for microelectronic applications. Epoxy resins are also preferred due to their thermal and chemical properties. Radiation curable compositions comprising a highly branched, multifunctional epoxy bisphenol A-novolac resins, such as Epon SU-8 from Momentive Specialty Chemicals Inc. is one example of a useful epoxy resin.

The vertical thin film transistors of the present invention are formed on a substrate. The substrates used in the present invention can be any material that acts as a mechanical support for the subsequently coated layers. The substrate can include a material such as glass, silicon, or metals, which are normally considered to be rigid. Particularly useful metals are stainless steel, steel, aluminum, nickel, or molybdenum. The substrate can also include a flexible material such as a polymer film or paper such as Teslin. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(ether sulfone) (PES), poly(phenylene sulfide) (PPS), or fiber-reinforced plastics (FRP). The thickness of substrate 110 can vary, typically, from about 100 μm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate any electric components such as thin film transistors. Nominally rigid materials that are flexible due to their thinness may also be used. These include glass at thicknesses below 200 μm and metals at thicknesses below 500 μm.

In some example embodiments, the substrate can include a temporary support or support material layer, for example, when additional structural support is desired for a temporary purpose, for example, during manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, or hydrophobic layers. The substrate surface can be treated in order to promote various properties. These treatments include plasma treatments, corona discharge treatments, and chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

The vertical thin film transistors of the present invention are composed of insulating, semiconductor and conductor materials. In preferred example embodiments of the present invention the insulating, semiconductor, and conductor materials are inorganic thin films. An insulating, or dielectric, material is any material that is a poor conductor of electricity. Such materials typically exhibit a bulk resistivity greater than $10^{10}$ Ω-cm. Examples of dielectrics include $SiO_2$, HfO, ZrO, $SiN_x$, or $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, or gallium arsenide. Particularly preferred semiconductors are zinc oxide, indium zinc oxide, or gallium indium zinc oxide. The semiconductors may be doped to render them n-type or p-type, or to modulated the number of charge carriers present. Conductors of the present invention include metals, such as Al, Ag, Au, Cr, Mo, or In, or inorganic conducting oxides, such as indium doped tin oxide (ITO) or aluminum doped zinc oxide (AZO).

The dielectric and semiconductor inorganic materials layers are conformal, and are preferably deposited using an atomic layer deposition process (ALD). ALD is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the first precursor on the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for use in manufacturing the present invention.

The preferred process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to, zinc oxide (ZnO), aluminum oxide ($Al_2O_3$), hafnium oxide, zirconium oxide, indium oxide, tin oxide, or the like. Mixed structure oxides that can be made using the process of the present invention can include, for example, InZnO. Doped materials that can be made using the process of the present invention can include, for example, ZnO:Al, $Mg_xZn_{1-x}O$, or LiZnO.

Metals that can be made using the process of the present invention include, but are not limited to, copper, tungsten, aluminum, nickel, platinum, ruthenium, or rhodium. It will be apparent to the skilled artisan that alloys of two, three, or more metals can be deposited, or that compounds can be deposited with two, three, or more constituents, and such things as graded films and nano-laminates can be produced as well.

Turning now to the figures, a schematic cross-sectional view of vertical transistors 100 and 200 of the present invention is shown FIG. 1*a*, taken along line A-A' of the schematic plan view shown in FIG. 1*b*. As shown in FIG. 1*a*, TFT 100 and TFT 200 are each a vertical transistor structure, where the vertical portion is defined by the first reentrant profile 140 and second reentrant profile 145 of the electrically conductive gate structure 120. The insulating layer 150 is in contact with the electrically conductive gate structure and the substrate 110. The semiconductor layer 160 is in contact with the insulating layer 150 and the first electrode 170, the second electrode 175 and the third electrode 180. As shown, the first electrode 170 and the second electrode 175 are located adjacent to the first and second reentrant profiles 140, 145, respectively. The first electrode 170 and the second electrode 175 are vertically spaced from the third electrode due to the height of the electrically conductive gate structure 120. The third electrode 180 is in conformal contact with a third portion of the semiconductor layer on the top of the electrically conductive gate structure. The first electrode 170 and the third electrode 180 define ends of a first channel of a first transistor 100. The second electrode 175 and the third electrode 180 define ends of a second channel of a second transistor 200. A first line C1, C1' extending between the ends of the first channel is not parallel to a second line C2, C2' extending between the ends of the second channel as shown in FIG. 1*c*.

Vertical transistors 100 and 200 include a substrate 110. As shown, the electrically conductive gate structure 120 is on the substrate, and extends away from the substrate to a top. The electrically conductive gate structure includes a first edge including first reentrant profile 140 and a second edge located opposite the first edge including second reentrant profile 145.

The electrically conductive gate structure 120 can contain both conductor and insulating materials, the only requirement being that the electrically conductive gate structure 120 has conductive material on vertical side walls of the reentrant profiles 140 and 145. The electrically conductive gate structure 120 can be fully formed of conductive materials, for example, metals or conductive oxides. The electrically conductive gate structure 120 has first reentrant profile 140 and second reentrant profile 145. To better understand the requirements for the electrically conductive gate structure 120, FIGS. 5a through 5c and FIGS. 6a through 6c will be discussed.

As shown in FIGS. 5a, 5b and 5c, the electrically conductive gate structure 120 can have any shape which has a height dimension 530a, 530b, 530c extending away from the substrate to a top 535a, 535b, 535c. The electrically conductive gate structure 120 also has edges along the height dimension, a first edge 510a, 510b, 510c including a first reentrant profile 540a, 540b, 540c and a second edge 520a, 520b, 520c opposite the first edge 510a, 510b, 510c and including a second reentrant profile 545a, 545b, 545c. The electrically conductive gate structure 120 has a width at the top 500a, 500b, 500c, and a minimum width 505a, 505b, 505c between the top and the substrate that is smaller than the width of the top. The reentrant profile is defined as the profile of the electrically conductive gate structure 120 that lies within the boundaries of the top of the electrically conductive gate structure 120, the substrate 110, and a line drawn orthogonal to the substrate from the edge of the top (as shown by lines P-P' in FIGS. 5a, 5b and 5c). To aid in understanding, the first reentrant profile 540a, 540b, and 540c in each figure is shown in bold. Additionally, the electrically conductive gate structure 120 can have portions that extend beyond the reentrant profile, as shown in FIG. 5c. The electrically conductive gate structure 120 shown in these figures can be fully formed of conductive materials or, in other example embodiments of the invention, the electrically conductive gate structure 120 structures can have an insulating core with an electrically conductive conformal gate layer coating. FIGS. 5a, 5b and 5c shown reentrant profiles obtainable with either an electrically conductive core or insulating structural polymer core. It should be recognized that the first and second reentrant profiles shown in FIGS. 5a, 5b and 5c (540a, 540b, 540c and 545a, 545b, and 545c) are equivalent to the first and second reentrant profiles 140 and 145 of FIGS. 1a through 1c.

FIGS. 6a and 6b show an example embodiment where the electrically conductive gate structure 120 is formed from a structural polymer post having an inorganic cap which is conformally coated by an electrically conductive gate layer 121. The embodiment shown in FIGS. 6a and 6b is an example of an electrically conductive gate structure that includes an electrically insulating material. As shown, the electrically insulating material includes post 20, and can include post 20 and cap 30. The schematic cross-sectional view of only the post 20, cap 30, and gate layer 121 are shown in FIG. 6a, taken along the line A-A' of the plan view shown in FIG. 6b. As shown in FIGS. 6a and 6b, a structural polymeric material post 20 is on substrate 110. The post 20 includes a height dimension 45 extending away from the substrate to a top defined by a length dimension 35 and a width dimension 25 over the substrate. The post 20 includes edges 40 along the height dimension. An inorganic material cap 30 is on top of the post 20. The cap 30 covers the top of the post 20 in the length dimension 35 and the width dimension 25 of the post. Cap 30 extends beyond the edges of the post in at least the width dimension 25. A conformal conductive material forms the gate layer 121 on the edges of the post and at least a portion of the substrate. As shown in FIG. 6a, the gate layer 121 conformally covers cap 30, the edges of post 20, and is also in contact with substrate 110. The portion of cap 30 which extends beyond the edges of the post forms a first and a second reentrant profile, 640 and 645, respectively. In other example embodiments, the gate layer 121 covers only the edges 40, 45 of the post 20 in the areas of the first and second reentrant profiles 640 and 645. In other embodiments, there is a conformal dielectric layer between the post 20 and the gate layer 121. In other embodiments of the present invention, the gate layer 121 can be in contact with an additional conductive layer which is on the substrate 110 and, in some embodiments, formed under post 20. In still other embodiments, the gate layer 121 does not fully cover the cap 30.

The electrically conductive gate structure 120 shown in FIGS. 6a and 6b is equivalent to the electrically conductive gate structure 120 shown in FIG. 5c. It should be understood that other embodiments having a structural polymer post having an inorganic cap which is conformally coated by an electrically conductive gate layer are included, and the invention is not limited to those shown. In still other embodiments, the polymer post has a reentrant profile as shown in FIG. 5b, and does not have an inorganic cap. First and second reentrant profiles are equivalent to first and second reentrant profiles 140 and 145 of FIGS. 1a through 1c.

Returning now to FIGS. 1a through 1c, vertical transistors 100 and 200 also include an electrically insulating material layer 150 and a semiconductor material layer 160. The conformal electrically insulating layer 150 maintains the first and second reentrant profiles 140,145 and is in contact with the electrically conductive gate structure 120 and at least a portion of the substrate 110. The insulating material layer 150 conforms to the reentrant profiles 140,145 of the electrically conductive gate structure 120 in transistors 100 and 200. Insulating material layer 150 can be said to coat the reentrant profiles 140,145 of the electrically conductive gate structure 120 and a portion of the substrate 110. The conformal electrically insulating layer 150 preferably has a uniform thickness. Insulating material layer 150 is often referred to as a dielectric material, layer, and as a gate insulator. Insulating material layer 150 includes first and second surfaces with the first surface being in contact with portions of surfaces of electrically conductive gate structure 120 and substrate 110. Insulating layer 150 is at least within the first and second reentrant profiles 140 and 145.

Semiconductor material layer 160 conforms to reentrant profiles 140,145 of the electrically conductive gate structure 120. As shown, the conformal semiconductor layer 160 maintains the first and second reentrant profiles 140,145 and is in contact with the conformal electrically insulating layer 150. Semiconductor layer 160 includes first and second surfaces with the first surface being in contact with the second surface of insulating layer 150. The conformal semiconductor layer 160 preferably has a uniform thickness. The semiconductor layer 160 is at least within the first and second reentrant profiles 140 and 145.

As shown, the first electrode 170 and the second electrode 175 are located adjacent to the first and second reentrant profiles 140, 145, respectively. A first line extending between the ends of the first channel is shown in FIG. 1c by line C1-C1'. A second line extending between the ends of the second channel is shown in FIG. 1c by line C2-C2'. As clearly evident in FIG. 1c, the first line C1-C1' is not parallel to the second line C2-C2'. Vertical transistors having this relationship between their channels cannot be formed over a broad area by line-of-sight deposition techniques such as thermal evaporation of metals.

Turning now to FIG. 4 for comparison, a conventional example of vertical transistors whose channels were defined using a line-of-sight deposition technique, such as evaporation or sputtering, is shown. In the conventional process, the electrically conductive gate structure, electrically insulating layer and semiconductor layers are similar to those of the present invention. However, the electrodes are formed by relying on the reentrant profiles of the electrically conductive gate structure 120 to physically shield the profile from the conductive material being deposited. As shown, this type of deposition results in the line defined by the first channel C1-C1' being parallel to the line defined by the line defined by the second channel C2-C2'. In the case of line-of-sight deposition, the lines C1-C1' and C2-C2' might be slanted with respect to the normal to the substrate, rather than aligned to the normal as shown (but the lines remain parallel to each other).

Returning once again to FIGS. 1a through 1c, the first electrode 170, second electrode 175 and the third electrode 180 are formed simultaneously and have the same material composition and layer thickness. The first electrode 170 is in contact with a first portion of the semiconductor layer 160 and is located adjacent to the first reentrant profile 140. The second electrode 175 is in contact with a second portion of the semiconductor layer 160 and located adjacent to the second reentrant profile 145. The third electrode 180 is in contact with a third portion of the semiconductor layer 160 on the top of the electrically conductive gate structure 120. The first electrode 170 and the third electrode 180 define ends of a first channel of a first transistor, and the second electrode and the third electrode define ends of a second channel of a second transistor. As shown, the first line extending between the ends of the first channel, C1-C1', is not parallel the second line extending between the ends of the second channel, C2-C2'. In some embodiments the first line C1-C1', is divergent from the second line C2-C2', on the side of the transistor closest the substrate; which is to say, that the distance between C1' and C2' is greater than that between C1 and C2.

As shown, the electrically conductive gate structure 120 functions as the gate for transistors 100 and 200. In some example embodiments of transistor 100, electrode 170 functions as the drain of transistor 100 and electrode 180 functions as the source of transistor 100. In other example embodiments of transistor 100, electrode 170 functions as the source and electrode 180 functions as the drain. The semiconductor device is actuated in the following manner. After transistor 100 is provided, a voltage is applied between the electrode 170 and the electrode 180. A voltage is also applied to the electrically conductive gate structure 120 to electrically connect the electrode 170 and the electrode 180.

Still referring to FIGS. 1a through 1c, vertical transistor 200 is formed at the same time as vertical transistor 100 is formed. Transistor 200 can be actuated in the following manner. A voltage is applied between the electrode 175 and the electrode 180, which is shared with vertical transistor 100. A voltage is applied to the conductive gate structure 120, which is shared with vertical transistor 100, to electrically connect the electrode 175 and 180.

Alternatively, transistor 100 and transistor 200 can be actuated in series by applying a voltage between electrode 170 and electrode 175. A voltage is applied to the conductive gate structure 120, which simultaneously electrically connects electrode 170 to electrode 180 and connects electrode 180 to electrode 175. This can be advantageous for circuit applications because external electrical connections do not need to be made to the elevated third electrode 180.

The reentrant profile 140 of transistor 100 allows a dimension of the semiconductor material channel of the transistor to be associated with the thickness (or height) of the electrically conductive gate structure 120, which functions as the gate, of transistor 100. Advantageously, this architecture of the present invention reduces reliance on high resolution or very fine alignment features during the manufacture of transistors that include short channels. Furthermore, the separation of the first electrode 170 and third electrode 180 is primarily determined by the reentrant profile 140 in the electrically conductive gate structure 120.

Referring back to FIGS. 5a through 5c and FIGS. 6a and 6b, the geometry of the electrically conductive gate structure 120 can vary as long as it meets the requirements of having a height dimension extending away from the substrate to a top, edges along the height dimension where a first edge includes a first reentrant profile and a second edge opposite the first edge includes a second reentrant profile. The electrically conductive gate structure 120 is only required to be conductive along the first 140 and second 145 reentrant profiles. However, in some embodiments the electrically conductive gate structure 120 is formed from only conductive materials, and is fully conductive. In other embodiments, the electrically conductive gate structure 120 is formed using a polymer post, optionally with an inorganic cap, that is conformally coated by an electrically conductive gate layer. It should be clear that all of the structures of FIGS. 5a through 5c and FIGS. 6a and 6b could be used in place of the electrically conductive gate structure 120 shown in FIGS. 1a and 1c, and are to be considered to be embodiments of the present invention. As such, the example embodiments of this invention should be understood to work with any electrically conductive gate structure 120 which meets the requirements as defined herein, and is not limited to the ones described.

An alternative example embodiment of the present invention is shown in FIGS. 2a and 2b. A schematic cross-sectional view of vertical transistors 102 and 202 of the present invention is shown FIG. 2a, taken along the line A-A' of the plan view shown in FIG. 2b. As shown in FIG. 2a, TFTs 102 and 202 each are a vertical transistor structure, where the vertical portion is defined by the reentrant profile of the electrically conductive gate structure 220. The electrically conductive gate structure 220 should be understood from the descriptions of FIGS. 1a through 1c, and previous descriptions. The electrically conductive gate structure 220 includes a reentrant profile 240, and the electrically conductive gate structure also has a top surface. The conformal electrically insulating layer 250 maintains the reentrant profile 240 and is in contact with the electrically conductive gate structure 220 and at least a portion of the substrate 110. The conformal semiconductor layer 260 maintains the reentrant profile 240 and is in contact with the conformal electrically insulating layer 250. An electrode 270 extends into the reentrant profile 240 and is in contact with a first portion of the semiconductor layer 260. Another electrode 280 is vertically spaced apart from and overlapping a portion of the electrode 270 which extends into the reentrant profile. Electrode 280 is also in contact with a second portion of the semiconductor material layer 260 over the top surface of the electrically conductive gate structure 220 and within the reentrant profile 240. This structure is a result of etching back a deposition inhibitor within the reentrant profile. The structure of FIGS. 2a and 2b have the advantage of very short channel lengths when compared with other vertical transistors.

The example embodiment shown in FIGS. 2a and 2b has an insulating layer 250 in contact with the electrically conductive gate structure 220 and the substrate 110. Semiconductor layer 260 is in contact with the insulating layer 250 and the first electrode 270, the second electrode 275 and the third electrode 280. As shown, the first electrode 270 and the second electrode 275 are located adjacent to the first and second reentrant profiles 240, 245, respectively. The first electrode 270 and the second electrode 275 are vertically spaced from the third electrode 280 due to the height of the electrically conductive gate structure 220. In the embodiment shown in FIGS. 2a through 2c, the third electrode 280 overlaps the first electrode 270 and is vertically separated from the first electrode 270 due to the height of electrically conductive gate structure 220. As shown, the first electrode 270 is partially located within the first reentrant profile 240, and the second electrode 275 is partially located within the first reentrant profile 245. The first electrode 270 and the second electrode 275 are in contact with portions of the semiconductor layer 260 that are not over the top or sides of the conductive gate structure 220. Additionally, the first electrode 280 is partially located in both the first and second reentrant profiles 240, 245 and in contact with the semiconductor layer 260 over the top of the conductive gate structure 220. This arrangement results in vertical transistors 102, 202 with shorter channel lengths than that shown in FIGS. 1a through 1c (100, 200)—all else being equal. The operation of vertical transistors 102 and 202 is identical to that of vertical transistors 100 and 200 and should be understood from the previous description.

An alternative embodiment of the present invention is shown in FIGS. 3a through 3c. A schematic cross-sectional view of vertical transistors 103 and 203 of the present invention is shown FIG. 3a, taken along the line A-A' of the plan view shown in FIG. 3b. As shown in FIG. 3a, TFTs 103 and 203 are vertical transistor structures, where each vertical portion is defined by the reentrant profile of the electrically conductive gate structure 120. The electrically conductive gate structure 120 should be understood from previous descriptions. As in previous embodiments, there is an insulating layer 350 in contact with the electrically conductive gate structure 120 and the substrate 110, and a semiconductor layer 360 in contact with the insulating layer 350. As shown, the first electrode 370 and the second electrode 375 are located adjacent to the first and second reentrant profiles 340, 345, respectively. The vertical transistors 103 and 203 do not share a common third electrode; instead, there is a third electrode 380 and a fourth electrode 385 in conformal contact with a third portion and a fourth portion of the semiconductor layer 360 on the top of the electrically conductive gate structure. The first electrode 370 and the second electrode 375 are vertically spaced from the third electrode 380 and fourth electrode 385 due to the height of the electrically conductive gate structure 120. As shown, the first electrode 370 and the third electrode 380 define the ends of a first channel of a first transistor 103, the second electrode 375 and the fourth electrode 385 define the ends of a second channel of a second transistor 203. First line C1-C1' extending between the ends of the first channel is not parallel to second line C2-C2' extending between the ends of the second channel. The operation of vertical transistors 103 and 203 is identical to the individual operation of vertical transistors 100 and 200 and should be understood from the previous description.

The present invention includes vertical transistors having an electrically conductive gate structure 120 and whose first, second and third electrodes 170, 175, 180 (source and drain electrodes) are formed using a selective area deposition process. In one embodiment of the present invention, the selective area patterning includes a process of coating a deposition inhibiting material, and then removing a portion of the deposition inhibiting material without removing all the deposition inhibiting material from the reentrant profiles of the electrically conductive gate structure. To better understand the present invention, a diagrammatic Step diagram for a process of making the vertical transistors of the present invention is shown in FIG. 7.

As shown in Step 710, a substrate is provided into the system. The substrate may be any substrate as previously discussed that is suitable for use with the vertical transistors of the present invention. In Step 720, an electrically conductive gate structure having a reentrant profile is provided on the substrate. Although the electrically conductive gate structure can be provided by any manufacturing process, FIGS. 9a and 9b outline the process flow for methods useful in the present invention.

Figure 9A:
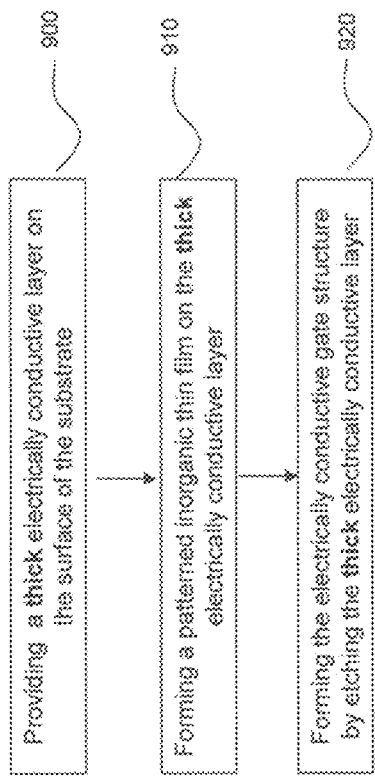
FIGS. 9a and 9b are flow charts describing processes for providing a conductive gate structure in accordance with the present invention.

Referring first to FIG. 9a, Step 720 is accomplished by forming a fully conductive electrically conductive gate structure. In Step 900, a thick electrically conductive layer is provided on the surface of the substrate. As used herein, a thick electrically conductive layer is defined to have a thickness greater than 300 nm and less than 10 microns, more preferably greater than 0.5 microns and less than 2 microns. The thickness of the thick electrically conductive layer will define the height of the electrically conductive gate structure, and is therefore chosen with that in mind. Furthermore, the height of the electrically conductive gate structure will define the channel length obtainable and should be of a sufficient height that the gate layer, insulating layer and semiconductor layer do not fill in (or close-up) the reentrant profile but also should be as thin as the desired channel length. The thick electrically conductive layer can be any of a variety of conductive materials known in the art including metals, degenerately doped semiconductors, conductive polymers, or printable materials including, for example, carbon ink, silver-epoxy, or sinterable metal nanoparticle suspensions. For example, the electrically conductive material layer can include doped silicon, or a metal, such as aluminum, chromium, gold, silver, nickel, copper, tungsten, palladium, platinum, tantalum, or titanium. Conductive materials can also include transparent conductors such as indium-tin oxide (ITO), ZnO, SnO2, or In2O3. Conductive polymers also can be used including, for example polyaniline, or poly(3,4-ethylenedioxythiophene)/poly(styrene sulfonate) (PEDOT: PSS). Alloys, combinations, or multilayers of these materials can be used. The first electrically conductive material layer can be deposited on substrate using chemical vapor deposition, sputtering, evaporation, doping, or solution processed methods.

Next, in Step 910, a patterned inorganic thin film is formed on the thick electrically conductive layer. The patterned inorganic thin film can be an insulating material, a semiconducting material, or a conducting material, and preferably will be a second electrically conductive layer. The patterned inorganic thin film can be provided in any way known in the art including, but not limited to, uniform deposition followed by patterning using photolithography and etching, or selective area deposition.

Next, in Step 920, the electrically conductive gate structure is formed by etching the thick electrically conductive layer, using the patterned inorganic thin film as a hard mask. The thick electrically conductive layer is etched such that a portion of patterned inorganic thin film extends beyond the remaining portion of the thick electrically conductive layer, forming a reentrant profile.

Figure 9B:
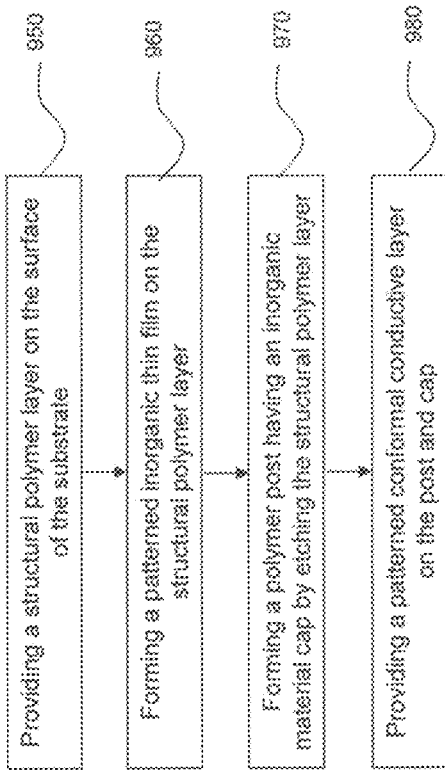

An alternative process for forming the electrically conductive gate structure is shown in FIG. 9b. The steps of FIG. 9b result in an electrically conductive gate structure formed from a structural polymer post having an inorganic cap which is conformally coated by an electrically conductive gate layer. First in Step 950, a structural polymer layer is provided on the surface of the substrate. The structural polymer may be any polymer that is stable in the final vertical transistor structure and should be understood from the previous descriptions. In this step, the structural polymer layer can cover only a portion of the substrate.

In Step 960, a patterned inorganic thin film is formed on the structural polymer layer. This step is preferably done using ALD, more preferably using spatial ALD. It is preferred that the inorganic thin film be a dielectric material. Prior to forming the patterned inorganic thin film, the surface of the structural polymer layer can be optionally treated (not shown). The treatment can be understood from the previous discussion and can include using UV-ozone or plasma processes. The inorganic thin film layer can be patterned as deposited in step 960 by using the combination of selective area deposition and ALD. Alternatively, the inorganic thin film layer can be deposited uniformly and patterned using any method known in the art, including photolithography and etching. The patterned inorganic thin film layer at least includes the pattern of the inorganic thin film cap.

In Step 970, the polymer post having an inorganic material cap is formed by etching the structural polymer layer. The polymer post having an inorganic material cap is formed by removing the portions of the structural polymer layer not covered by the patterned inorganic thin film, and some portions of the structural polymer layer that are under the inorganic thin film to create a reentrant profile. The reentrant profile is defined by the inorganic thin film material overhanging, or extending beyond, the wall of the polymer post. This step can be accomplished using two different processes, or preferably in a single process. In some embodiments, using selective area deposition, the patterned inhibitor layer can be removed prior to the removal of the portions of the structural polymer layer by a liquid process using a solvent or a detergent or by vapor process. Processes for forming the post include exposing the substrate to a vapor reactant that causes removal of the structural polymer. The removal can happen spontaneously upon reaction with the vapor, resulting in the conversion of the inhibitor to a volatile species. Alternatively, the vapor exposure can react with the structural polymer converting it to another species or morphology that is then more easily removable with another process, such as a liquid process. The vapor exposure can include forms of energy to promote the process including, for example, light exposure, arcs or plasmas. Particularly desired light exposures include UV exposure, especially in the presence of oxygen to produce ozone. Plasmas include plasmas of various species including oxygen, chlorine, or fluorine. Plasmas created with these materials or with precursors that produce these materials are included in the present invention. The removal portions of the structural polymer layer can be accomplished by a single exposure to a highly reactive oxygen processes including a UV-ozone process (UVO) or O2 plasma.

After the post and cap structure has been formed, the electrically conductive gate structure is formed by providing a conformal conductive layer on the post and cap structure in step 980. The conformal conductive layer, or gate layer, is preferably deposited using an ALD process, and more preferably by a spatial ALD process. The gate layer can be patterned at the time of deposition using a selective area deposition process or can be deposited uniformly and patterned using standard photolithographic techniques. As patterned, the gate layer covers at least some portion of the edges of the post formed in Step 970. Prior to forming the gate layer, the post and cap structure, as well as portions of the substrate, can optionally be covered with a dielectric layer (not shown). This dielectric layer provides a uniform material surface on which to deposit the gate layer which can increase the overall quality of the gate layer.

Referring back to the process flow of FIG. 7, once the electrically conductive gate structure has been provided in Step 720, a conformal insulating layer is formed over and in contact with electrically conductive gate structure in Step 730. The insulating layer is a conformal dielectric layer that is preferably deposited using an ALD process, and more preferably by a spatial ALD process. Conformal coating implies that electrically insulating material layer 150 deposits with a substantially uniform thickness even in the reentrant profiles 140 and 145 of electrically conductive gate structure 120. The electrically insulating layer 150 is often referred to as a gate dielectric. A dielectric material is any material that is a poor conductor of electricity, and should be understood from the previous descriptions. Preferably the insulating layer is an inorganic thin film dielectric layer. The insulating layer can be patterned at the time of deposition using a selective area deposition process or can be deposited uniformly and patterned using standard photolithographic techniques. Typically, the patterned insulating layer includes vias to the gate layer for making contact in future processing steps. The patterned insulating layer can be a single layer, or be a multilayer stack.

Next, the conformal semiconductor layer is formed in Step 740. The semiconductor is preferably a thin film inorganic material layer, for instance ZnO or doped ZnO. The patterned semiconductor layer can be patterned at the time of deposition using a selective area deposition process or can be deposited uniformly and patterned using standard photolithographic techniques. Preferably the semiconductor layer is deposited using an ALD process and more preferably by a spatial ALD process. The semiconductor layer is in contact with the insulating layer at least over the portion of the electrically conductive gate structure within in the first and second reentrant profiles.

The conformal coating process used to deposit semiconductor material layer 160 can be the same process used previously to coat the insulating material in Step 730. Alternatively, the conformal coating process can be different. A semiconductor is a material in which electrical charges can move but in which the concentration of electrical charges can be substantially modulated by external factors such as electrical fields, temperature, or injection of electrical charges from a neighboring material. As the semiconductor material 160 acts as a channel between source and drain electrodes when the electrically conductive gate layer stack 120 is energized, it is important that the conformally coated material be provided with a consistent or uniform thickness at least in reentrant profiles 140 and 145 of electrically conductive gate structure 120.

To complete the vertical transistor, the source and drain electrodes are simultaneously deposited. To accomplish this, a deposition inhibiting material is deposited on a portion of the substrate and the electrically conductive gate structure including filling the reentrant profile as shown in Step 750. The deposition method can include, but is not limited to, spray-coating, spin-coating, ink-jet coating, or slot-die coating. The uniformity of thickness of the layer is not critical.

Next, a portion of the deposition inhibiting material is removed without removing all of the deposition inhibiting material from the reentrant profile in Step 760. In Step 760, the reentrant profile protects the deposition inhibiting material from the removal process. In one embodiment, the deposition inhibiting material is photo-patternable. In a preferred embodiment, the deposition inhibiting material is polymeric material and a "positive resist" as is commonly defined in the art, indicating that it will become soluble in a suitable developer solution where it is exposed to light (and remain where it is unexposed). By exposing the top surface of the deposition inhibiting material to the appropriate wavelengths of light for the positive resist, the portions of the deposition inhibiting material within the reentrant profile are shielded by the top portion of electrically conductive gate structure 120, while the remaining deposition inhibiting material is exposed. Optionally, an optical mask with low resolution (one with feature sizes greater than about 0.1 mm) can be positioned over the surface (between the light and the deposition inhibitor) to further pattern the deposition inhibitor. The feature sizes on the optical mask are much greater than that of the height of the electrically conductive gate structure, and are not used to define the length of the channel. After exposure, the deposition inhibiting material can be developed, and thus removed from locations not shielded either by the reentrant profile or by features on the optional optical mask. In another embodiment, the deposition inhibiting material, regardless of whether it is photo-patternable or not photo-patternable, is removed by an etching process such that the top portion of electrically conductive gate structure 120 protects deposition inhibiting material within the reentrant profiles. Etching processes are preferably energetic oxygen-containing process such oxygen plasmas or UV-ozone. The deposition inhibiting material remains in at least a portion of the reentrant profile after completing Step 760. It will be understood by those skilled in the art that the position of the edges of deposition inhibiting material can be adjusted by choice of exposure conditions, development conditions, and by subsequent etching. For example the edges can be adjusted etching to form the vertical transistor structure shown in FIG. 2*a*. An example of a photo-patternable deposition-inhibiting material is PMMA, poly(methyl methacrylate).

Step 770 deposits a patterned electrically conductive material layer such that the electrically conductive material layer is not deposited on the deposition inhibitor. This process is chosen to work with the deposition inhibitor material used in Step 760. Preferably the deposition process used in the selective area deposition process is a conformal process. The electrically conductive material is preferably deposited using an ALD process, and more preferably a spatial ALD process.

After the electrically conductive material layer has been deposited, the deposition inhibitor material can be optionally removed as shown in Step 780. In some embodiments, the electrically conductive material can be further patterned using standard photolithographic techniques.

The present invention includes vertical transistors having a electrically conductive gate structure 120 and whose first, second and third electrodes 170, 175, 180 (source and drain electrodes) are formed using a selective area deposition process. In another embodiment of the present invention, the reentrant profiles of the electrically conductive gate structure are filled with deposition inhibitor using capillary filling, also known as capillary action, or wicking. To better understand this embodiment of the present invention, a diagrammatic Step diagram for a process of making the vertical transistors using a capillary filling process is shown in FIG. 8.

Figure 8:
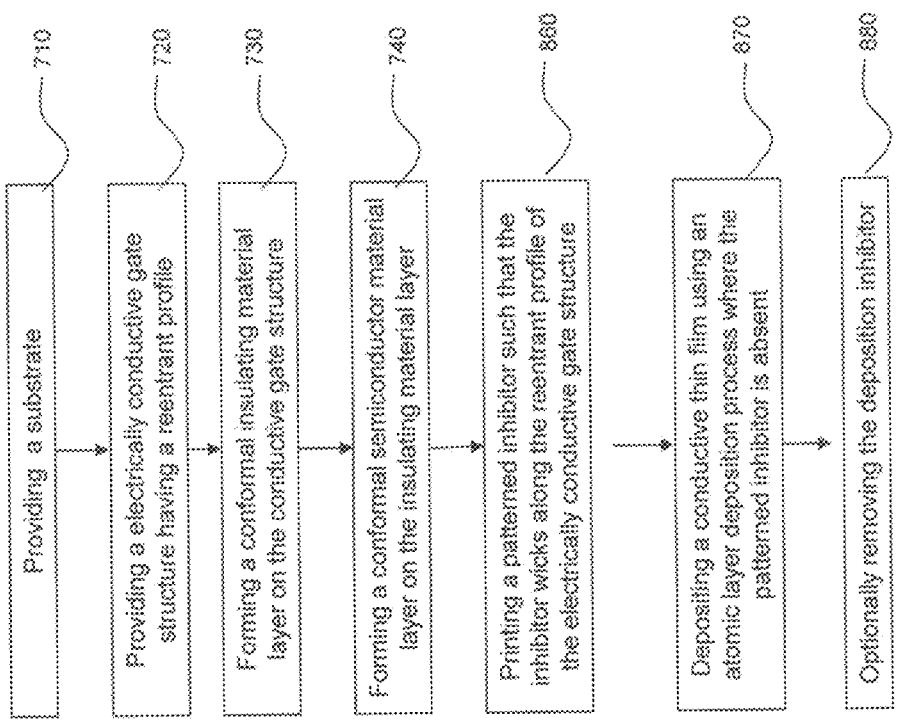
FIG. 8 is a flow chart describing an example embodiment of a process for forming a vertical thin film transistor using wicking in accordance with the present invention.

As shown in FIG. 8, the first four steps of forming vertical transistors using a wicking process and selective area deposition are identical to the first four steps of the process presented in FIG. 7 and should be understood from the previous descriptions. For completeness, they include providing a substrate in Step 710. Next, in Step 720, an electrically conductive gate structure having a reentrant profile is provided on the substrate. A conformal insulating layer is formed over and in contact with electrically conductive gate structure in Step 730, followed by forming the conformal semiconductor layer in Step 740.

To complete the vertical transistor, the source and drain electrodes are deposited simultaneously. To accomplish this via a wicking process, a deposition inhibiting material is formulated into an inhibitor ink for printing. Preferably, a polymeric inhibitor is selected as the deposition inhibiting material. A patterned polymeric inhibitor is printed such that the inhibitor wicks along the reentrant profile of the electrically conductive gate structure as shown in Step 860. The inhibitor ink has a surface tension and a viscosity associated with it. The inhibitor ink is deposited in a patterned way, adjacent to the reentrant profiles of the electrically conductive gate structure such that the inhibitor ink is drawn into the reentrant profiles by capillary action, also known as wicking. Printing methods include, but are not limited to, inkjet, gravure, microcontact, or flexographic printing processes.

The distance that a liquid is moved by capillary action depends on multiple factors, including the chemical nature and wetting properties of the substrate surface, the surface tension and viscosity of the moving liquid, or the drying rate of the liquid. Conditions and patterns are chosen in Step 860 such that the inhibitor ink fills the reentrant profiles of the electrically conductive gate structure over a distance sufficient to separate the third electrode from the first electrode and define the width of the channel of the vertical transistor. In a preferred embodiment, the pattern chosen consists of an open area sized to be the desired width of the channel, which is centered over the electrically conductive gate structure. The inhibitor ink from the edges of the open area wick into the reentrant profile from each side and meet in the center region to fill the reentrant profile that lies within the open area of the pattern. The ink is then dried to leave deposition inhibitor in the reentrant profile. As such, transistor channels formed using this method can have channel lengths that are vary along the width of the channel as the inhibitor will typically extend beyond the reentrant profile by a greater amount at the edges of the pattern than in the center region.

After printing the deposition inhibitor in Step 860, the patterned electrically conductive material layer is deposited such that the electrically conductive material layer is not deposited on the deposition inhibitor in Step 870. Step 870 is equivalent to Step 770, with the process chosen to work with the deposition inhibitor material used in Step 860. The electrically conductive material is preferably deposited using an ALD process, and more preferably a spatial ALD process. After the electrically conductive material layer has been deposited, the deposition inhibitor material can be optionally removed as shown in Step 880.

The process flow described in FIG. 7, as used to build the vertical transistors 100 and 200 of FIGS. 1*a* through 1*c*, can be better understood through the descriptive process build shown in FIGS. 10*a* and 10*b* through 17*a* and 17*b*. Thicknesses of the layers are not drawn to scale, but are sized for illustrative purposes. The geometries illustrated were chosen for their simplicity in illustrating the various components of the present invention and should not be considered limiting. In FIGS. 10*a* and 10*b*, the substrate 110 and electrically conductive gate structure 120 having first and second reentrant profiles 140,145 are provided as in Step 710 and Step 720 of FIG. 7.

FIGS. 11*a* and 11*b* illustrate one example embodiment of Step 730 in FIG. 7, forming a conformal insulating layer 150 on the electrically conductive gate structure 120. Forming the conformal insulating layer 150 maintains first reentrant profile 140 and the second reentrant profile 145 and is preferably done using an ALD process, more preferably using a spatial ALD process. As shown in FIGS. 11a and 11b, the conformal insulating layer 150 can be patterned. Patterning the conformal insulating layer 150 can be done using any method known in the art, including photolithography or selected area deposition. The conformal insulating layer 150 can be a single layer, or a multilayer dielectric stack. As shown, in one example embodiment the conformal insulating layer 150 is not deposited on, or is subsequently removed from, an area to form a via 70 down to a portion of the electrically conductive gate structure 120.

Figure 12B:
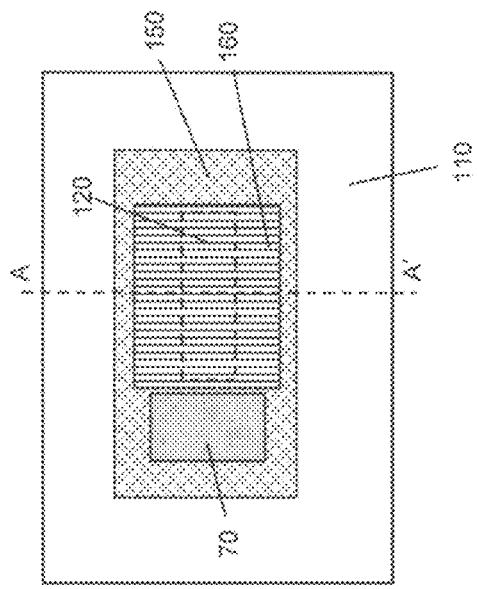
Figure 12A:
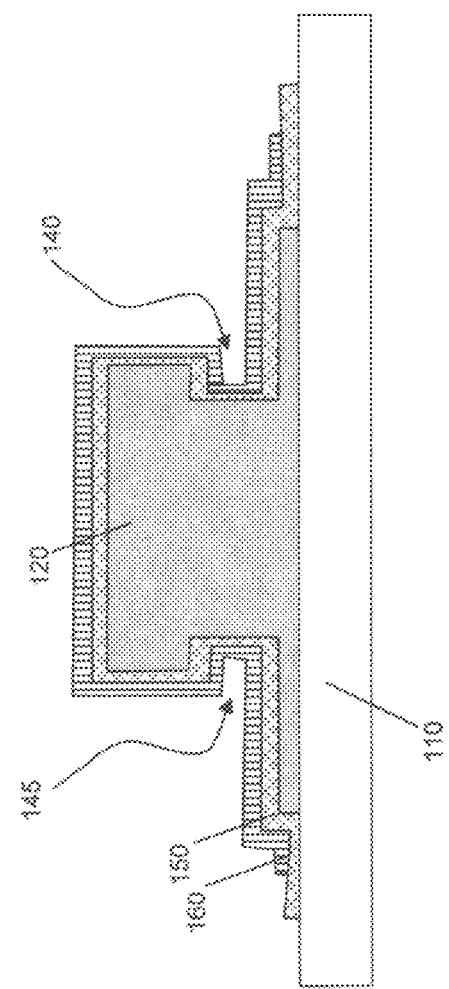

FIGS. 12a and 12b illustrate the result of one example embodiment of Step 740 in FIG. 7, whereby a conformal semiconductor layer 160 is formed on the conformal insulating layer 150. The conformal semiconductor layer 160 is at least present in the first reentrant profile 140 and the second reentrant profile 145 of the electrically conductive gate structure 120, and can be said to maintain these profiles. Forming the conformal semiconductor layer 160 is preferably done using an ALD process, more preferably using a spatial ALD process. As shown in FIGS. 12a and 12b, the conformal semiconductor layer 160 can be patterned. Patterning the conformal semiconductor layer 160 can be done using any method known in the art, including photolithography or selected area deposition. As shown in FIG. 12b, conformal semiconductor layer 160 is patterned in a rectangular area including a portion of conductive gate structure 120, and not including the area of via 70.

FIGS. 13a and 13b illustrate one embodiment of Step 750 in FIG. 7; as shown a deposition inhibiting material 41 is deposited on a portion of the substrate and the electrically conductive gate structure including filling the reentrant profile. The deposition method can include, but is not limited to, spray-coating, spin-coating, ink jet coating, or slot-die coating. The uniformity of thickness of the layer is not critical.

FIGS. 14a and 14b through 15a and 15b illustrate an embodiment of Step 760 in FIG. 7, where a portion of the deposition inhibiting material 41 is removed without removing all of the deposition inhibiting material 41 from the reentrant profile. As shown in FIGS. 14a and 14b the deposition inhibiting material 41 is photo-patternable, and the patterning uses the optional low resolution optical mask 60. Optical mask 60 has open areas 62 which allow the light to pass, and dark areas (typically chrome) 64 which block the light. The deposition inhibiting material 41 is exposed to light through the mask as shown in FIG. 14a. By exposing the top surface of the deposition inhibiting material to the appropriate wavelengths of light for the positive resist (deposition inhibiting material 41), the portions of the deposition inhibiting material 41 within the reentrant profile are shielded by the top portion of electrically conductive gate structure 120, while the deposition inhibiting material 41 left unprotected (or exposed) under the open areas 62 of the mask 60 are exposed.

Figure 15B:
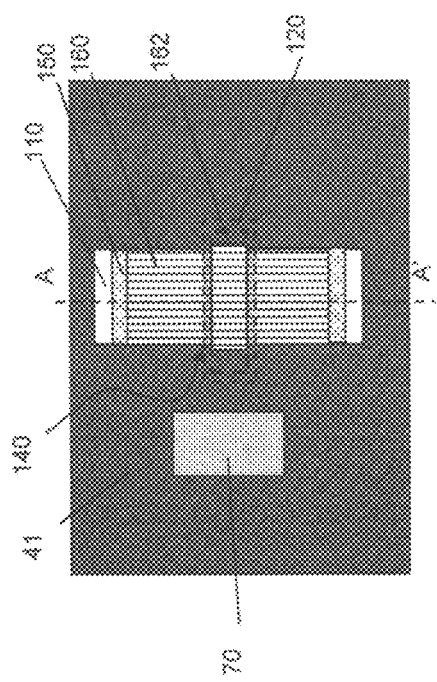
Figure 15A:
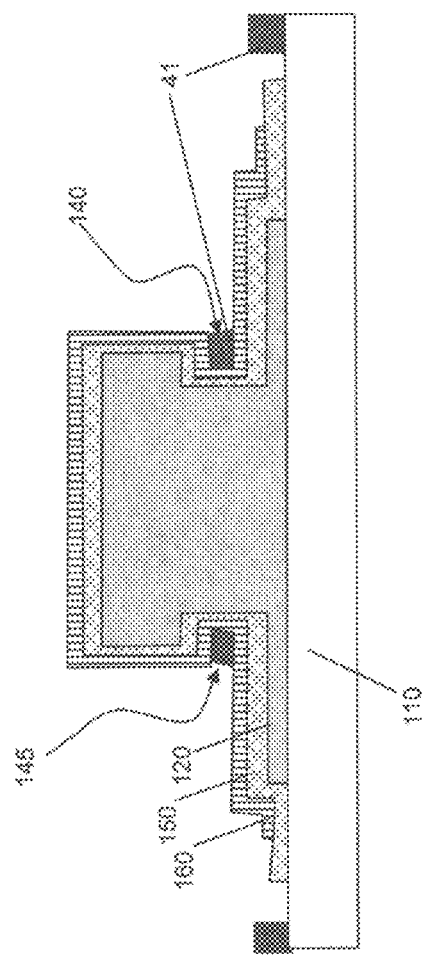

After exposure, the deposition inhibiting material 41 is developed, and the resultant structure is shown in FIGS. 15a and 15b. As shown the deposition inhibiting material 41 is removed from locations not within the reentrant profile, and deposition inhibiting material 41 remains in at least a portion of the reentrant profile after completing Step 760. As shown in FIG. 15b the deposition inhibitor 41 was removed over via 70 in order to contact a portion of the electrically conductive gate structure 120. One preferred deposition-inhibiting material for this embodiment is PMMA, poly(methyl methacrylate).

The results of Step 770 of FIG. 7 are shown in FIGS. 16a and 16b, where a patterned electrically conductive material layer has been deposited such that the electrically conductive material layer is not deposited on the deposition inhibitor. This is accomplished by a selective area deposition, in which the substrate with deposition inhibitor as shown in FIGS. 15a and 15b is subjected to the conditions for uniform deposition and the conductive material only deposits where the deposition inhibitor 41 is not present. The electrically conductive material is preferably deposited using an ALD process, and more preferably a spatial ALD process. As shown, Step 770 forms the first electrode 170, the second electrode 175 and the third electrode 180 simultaneously. Additionally, first electrode 170, the second electrode 175 and the third electrode 180 are in conformal contact with the semiconductor layer 160.

The deposition inhibitor is optionally removed in step 780, and the resultant structure is shown in FIGS. 17a and 17b. As shown, the structure is equivalent to the structure shown in FIGS. 1a through 1c and should be understood from the previous description.

In some example embodiments, the separation between the first and third electrodes (and second and third electrodes) which define the ends of the channel of the transistor, can happen in a separate step from patterning the remaining portion of the source and drain electrodes. In these embodiments, the optional mask is not used during the exposure of the photo-patternable inhibitor, and the inhibitor only remains in the reentrant profile. Therefore, after selectively depositing the inorganic thin film conductive layer using the polymer inhibitor remaining in the reentrant profile, the inorganic thin film conductive layer is further patterned using standard photolithographic techniques. The critical dimension of the channel length is defined by the polymeric deposition inhibitor in the reentrant profile and not the photolithographic patterning step.

In some embodiments of the process of FIG. 7, the semiconductor layer 160 can be deposited as a uniform layer, and patterned using any method known in the art after the patterning of the first, second and third electrodes. Similarly, in other embodiments, the insulating layer 150 can be deposited as a uniform layer, and patterned using any method known in the art after the patterning of the first, second and third electrodes.

The process flow described in FIG. 8, using wicking to build the vertical transistors 100 and 200 of FIGS. 1a through 1c, can be better understood through the descriptive process build shown in FIGS. 18a and 18b through 22a and 22b. The first four steps of FIG. 8 are identical to those of FIG. 7, and should be understood from the process build of FIGS. 10a and 10b through 12a and 12b.

Figure 18B:
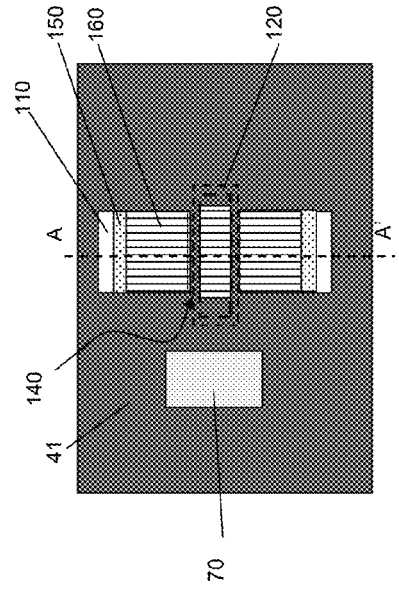
FIGS. 18a-18c are schematic views showing vertical transistor formation using the process flow described in FIG. 8 with FIGS. 18a and 18b being cross-sectional plan views and FIG. 18c being a cross sectional side view.
Figure 18A:
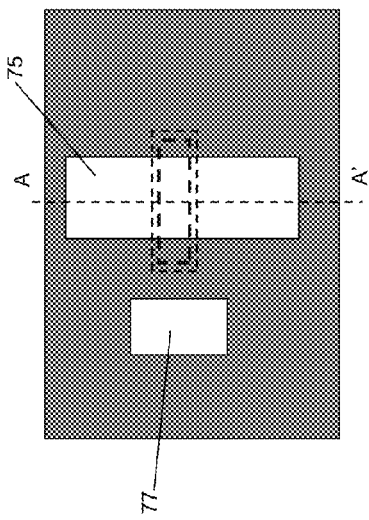
Figure 18C:
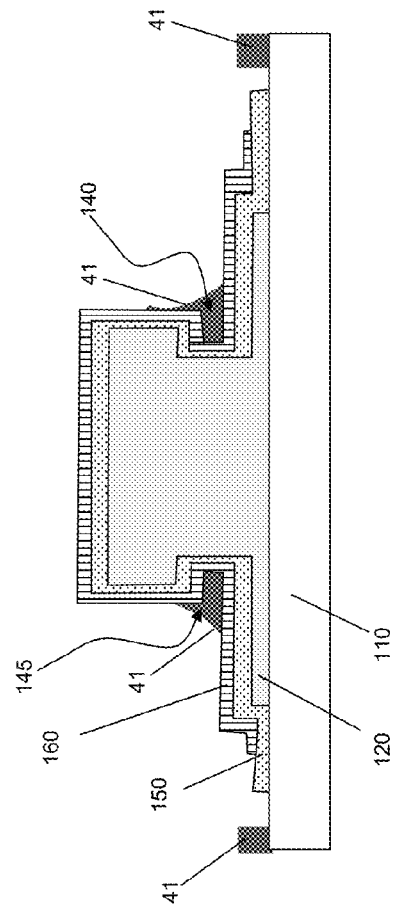

FIGS. 18a through 18c illustrate the use of a printed deposition material to form the source and drain of transistor 100 on the structure shown in FIGS. 1a and 1b. Here, a patterned polymeric inhibitor 41 is printed such that the inhibitor wicks along the reentrant profile of the electrically conductive gate structure as described in Step 850 of FIG. 8. Printing the inhibitor can be accomplished using inkjet, flexography or a gravure printing process.

FIG. 18a illustrates the pattern to be printed, where there are two open areas 75 and 77. Area 77 serves to allow deposition of the electrically conductive material over an optional via to the conductive gate structure 120, and is, itself, optional. Open area 75 crosses over the electrically conductive gate structure 120. As designed, open area 75 contains no printed inhibitor regions. FIGS. 18b and 18c show the result of printing the deposition inhibitor 41 using the pattern of FIG. 18a over a structure with reentrant profile 140. FIG. 18c is a cross-sectional view of FIG. 18b taken along the line A-A'. Although the open area 75 is uniform and free of directly printed inhibitor, the liquid inhibitor ink wicks, or moves through capillary forces, into the reentrant profile 140. The fluid properties of the deposition inhibitor ink in combination with the surface properties of the underlying layer will determine how wide of a transistor channel can be fabricated. Additionally, these properties in combination with the surface properties of the underlying layer(s) determine the channel length as the liquid will also spread out on to the substrate surface. Optionally, the inhibitor can be cured after printing the inhibitor and prior to depositing the electrodes. Preferably curing the inhibitor includes drying or cross-linking the inhibitor.

Figure 19A:
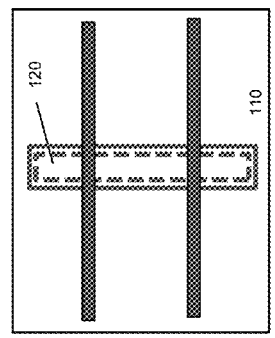
FIGS. 19a-19c are schematic plan views showing inhibitor pattern formation in accordance with the present invention.
Figure 19B:
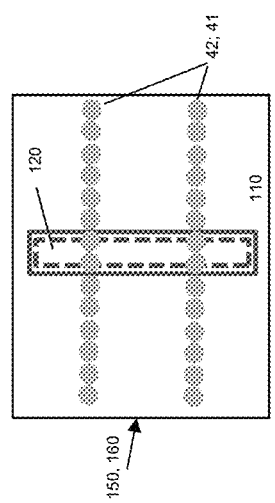
Figure 19C:
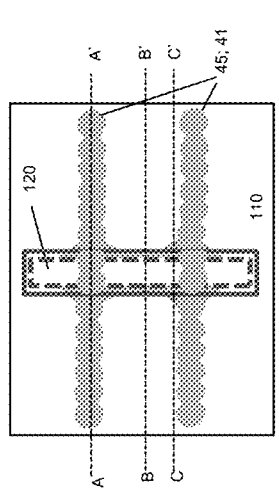
Figure 20A:
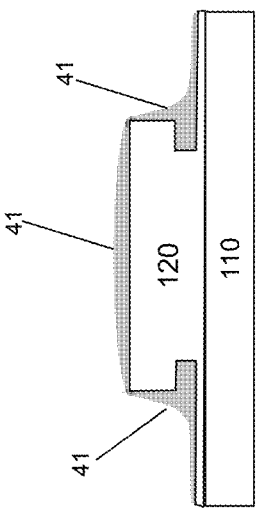
FIGS. 20a-20c are schematic cross-sectional views of FIG. 19c showing inhibitor locations after a wicking process.
Figure 20B:
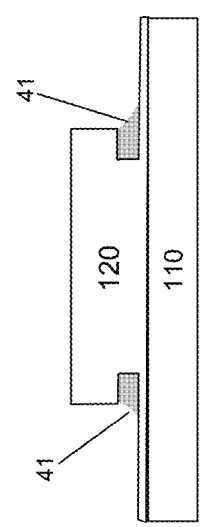
Figure 20C:
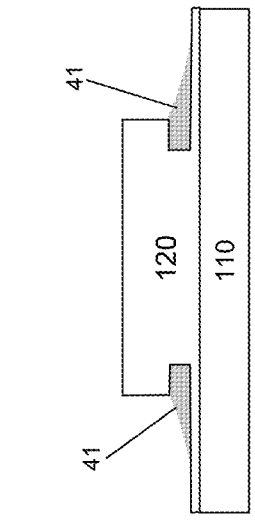

FIGS. 19a-19c and 20a-20c further serve to explain how the electrode pattern is formed from a design. FIG. 19a shows a design to be printed, in this embodiment a simple two line pattern. FIG. 19b shows schematically the placement of individual drops 42 of inhibitor 41 using the pattern of FIG. 19a with an ink jet printer. FIG. 19c illustrates the pattern of FIG. 19a printed with using an inkjet printer where the printed inhibitor 41 has interacted with the substrate (indicated using 45). The result shown can be obtained when the surface of the substrate 110 and electrically conductive gate structure 120 are hydrophilic, and the ink is aqueous based. The relative surface energy of the structure and ink interface results in the ink traveling along the three sided capillary formed by the electrically conductive gate structure 120. FIGS. 20a through 20c are cross-sectional views taken along the lines A-A', B-B' and C-C' of FIG. 19c, respectively, and show the wicking of the ink (inhibitor 41) at various locations of the substrate.

In some embodiments, the printed inhibitor pattern can be adjusted by removing a portion of the inhibitor without removing all of the inhibitor from the reentrant profile prior to depositing the conductive inorganic thin film. This can be done to clean up the edges of the inhibitor that extend beyond the reentrant profile due to the wicking process. In some embodiments an oxygen plasma process can be used.

Figure 21B:
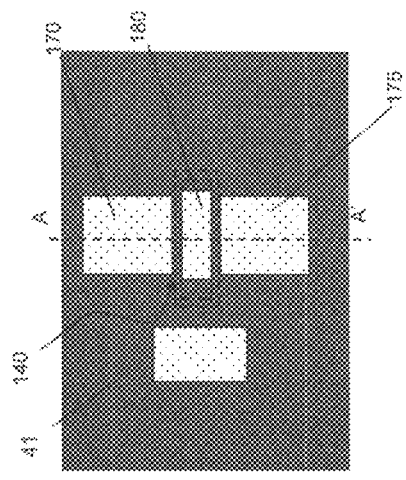
Figure 22B:
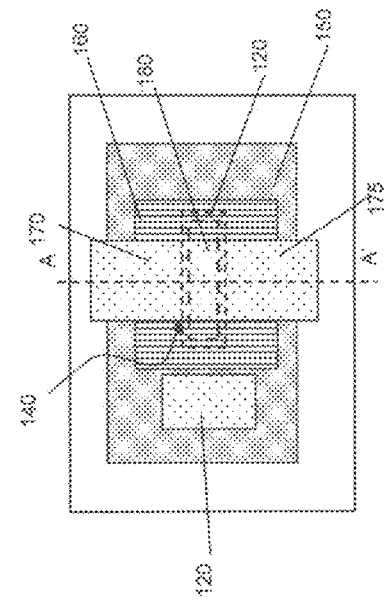
Figure 21A:
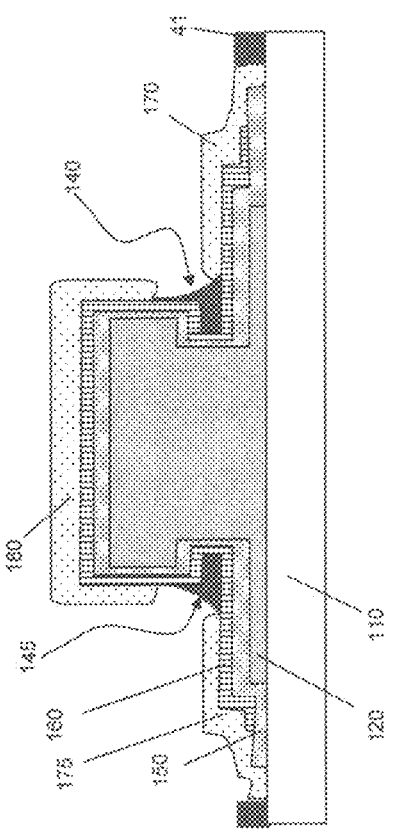
Figure 22A:
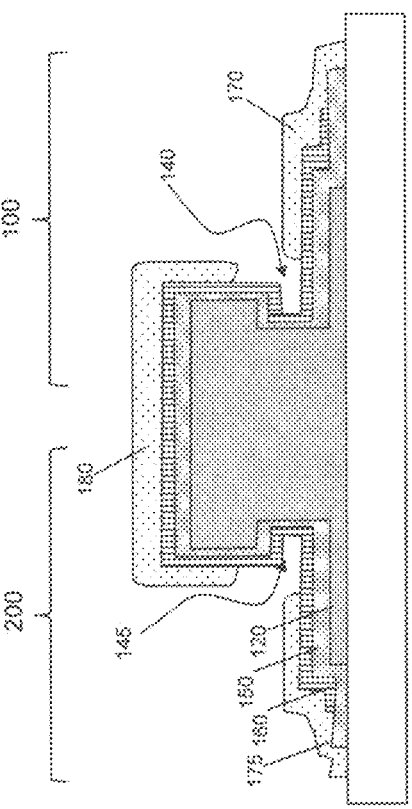

FIGS. 21a and 21b show the results of one embodiment of Step 870, depositing a conductive inorganic thin film using an atomic layer deposition process where the patterned polymeric inhibitor is absent. In some example embodiments, the conductive inorganic thin film is a transparent conductive oxide (TCO). The inorganic thin film conductive layer is deposited by an Atomic Layer Deposition (ALD) process on the substrate shown in FIGS. 18b and 18c, resulting in patterned deposition of the first electrode 170, the second electrode 175 and the third electrode 180. The structure shown in FIGS. 22a and 22b depict the result of Step 880 after the deposition inhibitor material has been optionally removed. The resultant vertical transistors 100 and 200 are similar in structure and equivalent in operation to those in FIGS. 1a and 1b.

In some embodiments, the separation between the first and third electrodes (and second and third electrodes) which define the ends of the channel of the transistor, can happen is a separate step from patterning the remaining portion of the source and drain electrodes. In these embodiments, after selectively depositing the inorganic thin film conductive layer using the wicked polymer inhibitor, the inorganic thin film conductive layer is further patterned using standard photolithographic techniques. In these embodiments, the critical dimension of the channel length is defined by the wicked polymeric deposition inhibitor in the reentrant profile and not the photolithographic patterning step. Furthermore, in some embodiments, the semiconductor layer 160 can be deposited as a uniform layer, and patterned using any method known in the art after the patterning of the first, second and third electrodes. Similarly, in other embodiments, the insulating layer 150 can be deposited as a uniform layer, and patterned using any method known in the art after the patterning of the first, second and third electrodes.

For clarity in the Examples, and for better understanding of the processes of providing the electrically conductive gate structure 120, descriptive process builds are provided for the process flows shown in FIGS. 9a and 9b. The process flow described in FIG. 9a can be better understood through the descriptive process build shown in FIGS. 23a and 23b through 25a and 25b. In Step 900, a thick electrically conductive layer 115 is deposited on the substrate 110 as shown in FIGS. 23a and 23b, The thick electrically conductive layer 115 can be any of a variety of conductive materials known in the art including metals, degenerately doped semiconductors, conductive polymers, and printable materials such as carbon ink, silver-epoxy, or sinterable metal nanoparticle suspensions. The thick electrically conductive layer 115 can be deposited on substrate 110 using chemical vapor deposition, sputtering, evaporation, doping, or solution processed methods.

Referring to FIGS. 24a and 24b, a patterned inorganic material layer 31 is deposited on the thick electrically conductive layer 115, as described in Step 910 in FIG. 9a. Inorganic material layer 31 can be an insulating material, a semiconducting material, or a conducting material, and preferably is electrically conductive. Patterned inorganic material layer 31 can be provided by any technique known in the art including depositing a uniform material layer, and then patterning to form patterned inorganic material layer 31 using photolithographic techniques. Alternatively, the patterned material layer 31 can be formed using selective area deposition.

Referring to FIGS. 25a and 25b, thick electrically conductive layer 115 is etched such that a portion of patterned inorganic material layer 31 extends beyond the remaining portion of electrically conductive layer 115, forming a first reentrant profile 140 and a second reentrant profile 145. The thick electrically conductive layer 115 and patterned inorganic material layer 31 form the electrically conductive gate structure 120, as shown in FIG. 25a, and as described in Step 920 of FIG. 9a.

The process flow described in FIG. 9b can be better understood through the descriptive process build shown in FIGS. 26a and 26b through 29a and 29b. In FIGS. 26a and 26b, a structural polymer layer 50 is provided on the substrate 110 as in Step 950 of FIG. 9b. The structural polymer layer 50 can be any polymer that is stable in the final vertical transistor structure and should be understood from the previous descriptions. In this step, the structural polymer layer 50 can cover only a portion of the substrate.

In Step 960, a patterned inorganic thin film 57 is formed on the structural polymer layer 50. As shown in FIGS. 27a and 27b, the patterned inorganic thin film 57 includes the pattern of the inorganic cap 30. This step can be done using any method known in the art, and should be understood with respect to the description of Step 960 of FIG. 9b.

In FIGS. 28a and 28b, the polymer post 20 having an inorganic material cap 30 is formed by etching the structural polymer layer 50 as described in Step 970 of FIG. 9b. Removing the portions of the structural polymer layer 50 not covered by the patterned inorganic thin film 57 and portions of the structural polymer layer 50 that are under the inorganic thin film 57 results in the polymer post 20 and inorganic cap 30 shown in FIGS. 28a and 28b. The structure has a first reentrant profile 140 defined by the portion of the inorganic thin film cap 30 overhanging the side wall 40 of the polymer post 20. The resultant post 20 has the same height as the thickness of the structural polymer layer 50, and a width 25 that is less than the width of the inorganic cap 30.

FIGS. 29a and 29b illustrate the result of Step 980 of FIG. 9b, forming a patterned conformal gate layer 121 over the post 20 and inorganic cap 30. The patterned conformal gate layer 121 can be formed using a selective area deposition process. In other embodiments of Step 980, the gate material can be deposited uniformly and patterned using standard photolithographic techniques, resulting in the electrically conductive gate structure 120 shown in FIGS. 29a and 29b.

EXPERIMENTAL RESULTS

Inventive Example I1

PMMA Photo-Patterned Electrodes

This example follows the process steps described in FIG. 7. A glass substrate was conformally coated with a first conductive material layer of 100 nm thick aluminum-doped zinc oxide (AZO) at 200 degrees Celsius using the SALD process described in U.S. Pat. No. 7,413,982 and the SALD apparatus described in U.S. Pat. No. 7,456,429 with the organo-metallic precursors diethyl zinc mixed with a low flow rate of dimethyl-aluminum isopropoxide, and water with an inert carrier gas of nitrogen.

A second conductive material layer of 450 nm molybdenum was deposited onto the substrate, including over the AZO layer, via sputtering (FIG. 9a, Step 900).

The substrate was then conformally coated with a third conductive material layer of 100 nm thick aluminum-doped zinc oxide (AZO) at 200 degrees Celsius using the same SALD process as for the first conductive layer.

Photolithography was used to pattern 100-micron wide photoresist lines along the length of the substrate. The portion of the third conductive layer which was not covered by resist was then etched in dilute acetic acid and the photoresist layer was stripped from the surface with solvents. The AZO stripes that remain act as both a hard mask for subsequent etching of molybdenum, and as the top portion of the conductive gate structure. This process forms a patterned inorganic thin film on the thick electrically conductive layer of molybdenum (FIG. 9a, Step 910).

The sample was plasma etched using $SF_6$ at 0.3 Torr and 200 W for 7.5 minutes using a Technics plasma etcher, which not only etched through the exposed molybdenum layer but also undercut some of the molybdenum layer located under the conductive aluminum-doped zinc oxide layer to form the first and second reentrant profiles. The sample was then cleaned with 0.3 Torr $O_2$ plasma at 200 W for 2 minutes.

Photolithography was used to pattern 300-micron-wide photoresist lines along the length of the substrate, roughly aligned so that the photoresist fully covered the 100-micron-wide lines already patterned on the substrate, and extended beyond on each side. The exposed portions of the first conductive layer of AZO were then etched using dilute acetic acid and the photoresist was stripped. This completed the conductive gate structure, which in this case consists of three conductive layers, the first AZO layer, the molybdenum layer, and the second AZO layer, forming the floor, wall, and ceiling respectively of a reentrant profile on the edge. This completed the fabrication of the electrically conducting gate structure as illustrated in FIG. 5c, using the process described in FIG. 9a.

The substrate and conductive gate structure were the conformally coated with a 12 nm thick of aluminum oxide insulating material layer at 200° C. using the SALD process as before, using the organo-metallic precursor trimethyl aluminum, water, and an inert carrier gas of nitrogen (FIG. 7, Step 730).

The insulating material layer was then conformally coated with a 12 nm semiconducting material layer of zinc oxide at 200° C. using the precursors diethyl zinc and ammonia gas, and water, with nitrogen as the carrier gas using the SALD process as before (FIG. 7, Step 740).

A layer of PMMA was spin-coated over the substrate at 2000 RPM and baked at 180° C. for 1 minute (FIG. 7, Step 750). The sample was then exposed to light including wavelengths of 185 nm. The PMMA in the reentrant profile of the gate edge, where it was shadowed by the AZO which is not transparent to the 185 nm light, was not exposed. Thus when the sample was developed in MIBK, the PMMA was removed everywhere on the substrate except in a portion of the recessed region at the gate edge (FIG. 7, Step 760.) The sample was baked on a 200° C. hotplate for 5 minutes and then put in an oxygen plasma (100 W, 0.3 T) for 10 seconds. The PMMA remaining acted as the deposition inhibiting material for the electrode deposition.

The substrate was returned to the SALD equipment and 100 nm of AZO was deposited using the same precursors and conditions as the first ones. The AZO only deposited in the areas of the pattern where the PMMA inhibitor was not present. Thus AZO was grown on the substrate adjacent to the first reentrant profile, on top of the gate structure, and adjacent to the second reentrant profile, but not within either of the first or second reentrant profiles which contained the deposition-inhibiting material (FIG. 7, Step 770). The sample was then subjected to a 2 minute $O_2$ plasma treatment to remove the PMMA inhibitor (FIG. 7, Step 780).

The final step of the processing was to isolate the devices from each other by etching away both AZO electrode material and ZnO semiconductor material between different transistors. This was accomplished by spinning PMMA A4 resist over the substrate and baking at 180° C. for 1 minute. Then, Microposit 1813 photoresist was spun over the PMMA layer and baked for 1 minute at 110 C. The 1813 was patterned using a chromium and glass mask to expose the 1813 everywhere except in a rectangle covering the transistor area. The PMMA was removed where it was not covered by 1813 using an oxygen plasma etch for 6 minutes. The sample was etched in dilute acetic acid to remove AZO and ZnO in the same step. Finally the photoresist was stripped to make measurements with probes easier.

Figures 30, 31:
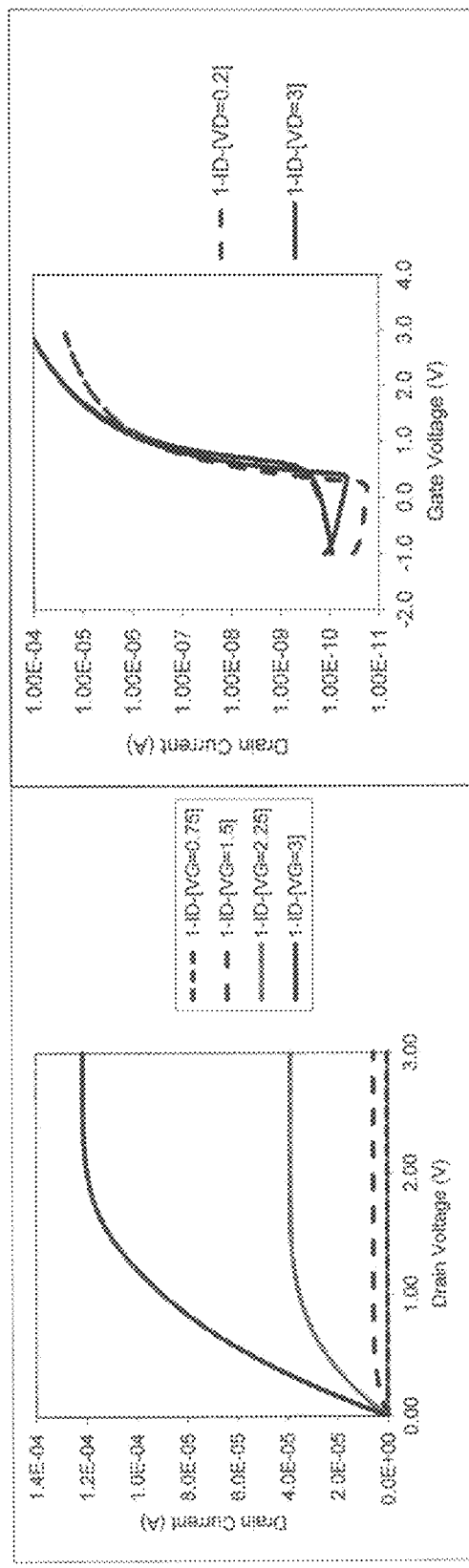
FIG. 30 is a graph showing performance $I_{ds}$-$V_d$ curve characteristics for the transistor of Inventive Example I1.
FIG. 31 is a graph showing performance $I_{ds}$-$V_g$ curve characteristics for the transistor of Inventive Example I1.

Testing of the transistors was accomplished by using a probe station to contact the AZO of the first and second electrode at the level of the substrate, as the source and drain, thereby testing the two transistors formed on either side of the conductive gate structure in series. The conductive gate stack was contact using the probe station and used to gate the transistors. Referring to FIG. 30, a graph showing $I_{ds}$-$V_{ds}$ curve characteristics for a transistor of the invention with a channel width of 400 micrometers is shown. Curves corresponding to different gate voltages of 0.75, 1.5, 2.25 and 3.0 volts can be seen. As can be seen in FIG. 30, the drain current versus drain voltage is very responsive to the gate voltage. The electrodes, though deposited in one step, are not connected to each other, but function as distinct source and drain electrodes. Referring to FIG. 31, a graph showing $I_{ds}$-$V_g$ performance for 0.2 and 3.0 volts on the drain electrode is shown for a device with channel width of 400 micrometers. As shown, the drain current responds well to the gate voltage, ranging from a small current of about $10^{-11}$ amps at a gate voltage of about 0 volts to greater than $10^{-4}$ amps at a gate and drain voltage of 3 volts.

Inventive Example I2

Electrodes Defined by Wicking PVP into the Reentrant Profile

The following example follows the process flow described in FIG. 8. A 70 nm chromium material layer was deposited via thermal evaporation on a 62.5 mm square glass substrate and patterned into 300-micron-wide lines using standard photolithography as follows. A patterned material layer of photoresist was formed by spin coating at 3000 rpm Microposit S1813 resist (Rohm and Haas Electronic Materials LLC, Marlborough, Mass.) placed on a hot plate for 60 sec at 110° C. and then exposed through a glass/chromium contact mask including 300-micron-wide lines for 65 seconds on a Cobilt mask aligner (Cobilt model CA-419), using the edges of the glass substrate as a low resolution or crude alignment. The sample was then developed for 60 seconds in Microposit MF-319 developer (Rohm and Haas Electronic Materials LLC, Marlborough, Mass.) and rinsed for 5 minutes in DI water. The exposed regions of the chromium material layer were then etched by a wet chromium etchant (FIG. 8, Step 710).

A 450 nm molybdenum material layer was deposited onto the substrate, including over the chromium lines, via sputtering (FIG. 9, Step 900).

The substrate was then conformally coated with an inorganic thin film of aluminum-doped zinc oxide (AZO), 100 nm thick, at 200° C. using the SALD process described in U.S. Pat. No. 7,413,982 and the SALD apparatus described in U.S. Pat. No. 7,456,429 with the organo-metallic precursors diethyl zinc mixed with a low flow rate of dimethyl-aluminum isopropoxide, and water with an inert carrier gas of nitrogen. The AZO is a conductive layer.

Photolithography was used to pattern photoresist lines (100-microns wide) on the conductive AZO layer to align approximately with the center of the chromium lines already patterned on the substrate. The portion of the conductive AZO layer which was not covered by resist was then etched in dilute acetic acid and the photoresist layer was stripped from the surface with solvents. The conductive AZO stripes that remain act as both a hard mask for subsequent etching of molybdenum, and as the top portion of the conductive gate layer stack. This process forms a patterned inorganic thin film on the thick electrically conductive layer of molybdenum (FIG. 9, Step 910).

The sample was plasma etched using $SF_6$ at 0.3 Torr and 200 W for 7.5 minutes using a Technics plasma etcher, which not only etched through the exposed molybdenum layer but also undercut some of the molybdenum layer located under the conductive AZO layer. (FIG. 9, Step 920, and FIG. 8, Step 730). The sample was then cleaned with 0.3 Torr $O_2$ plasma at 200 W for 2 minutes.

This completed the conductive gate structure, which in this case consists of three conductive layers, the chromium, the molybdenum, and the AZO, forming the floor, wall, and ceiling respectively of a reentrant profile on the edge. The conductive gate structure is schematically represented in FIG. 5c.

The substrate and conductive gate structure were then conformally coated with a 12 nm thick of aluminum oxide insulating material layer at 200° C. using the SALD process as before with the organo-metallic precursor trimethyl aluminum, water, and an inert carrier gas of nitrogen (FIG. 8, Step 730).

The insulating material layer was conformally coated with a 12 nm semiconducting material layer of zinc oxide at 200° C. using the precursors diethyl zinc and ammonia gas, and water, with nitrogen as the carrier gas using the SALD process as before (FIG. 8, Step 740).

The substrate was then exposed to oxygen plasma, 0.3 T at 100 W for 2 minutes, and a pattern of deposition-inhibiting material, also referred to as inhibitor ink, was applied using a Fuji Dimatix 2500 piezo-inkjet printer. The inhibitor ink was a 2 wt % solution of PVP k-30 in diacetone alcohol. The pattern printed for each device was a pair of rectangles located so that each one crosses a gate stack line and covers a portion of the substrate between lines, and are spaced apart from each other by the distance desired for the width of the vertical transistor (illustrated schematically in FIG. 19a). The printed inhibitor ink spread as it came in contact with the substrate, and where the pattern of inhibitor ink met the reentrant profile of the conductive gate structure the fluid was drawn along the recess by capillary forces so that the fluid drawn from one printed rectangle met the fluid drawn from the other (illustrated schematically in FIG. 19c). The reentrant profile, which eventually formed the channel of the transistor, was thereby covered by inhibitor ink (shown schematically in FIGS. 20a through 20c).

Following the patterning of the inhibitor, the substrate was returned to the SALD equipment and 100 nm of AZO was deposited as described above. Due to the presence of the wicked PVP inhibitor, the AZO only deposited in the areas of the pattern where the PVP was not present (FIG. 8, Step 870). Thus, AZO was grown on the substrate adjacent to the first reentrant profile, on top of the gate structure, and adjacent to the second reentrant profile, but not within either of the first or second reentrant profiles which contained the PVP inhibitor or on the other portions of the substrate where the PVP inhibitor was present. The sample was then subjected to a 2 minute $O_2$ plasma treatment to remove the PVP inhibitor.

The final step of the processing was to isolate the devices from each other by etching away both AZO electrode material and ZnO semiconductor material between different transistors. This was accomplished by spinning 950 PMMA A4 (MicroChem, Newton, Mass.) resist over the substrate and baking at 180° C. for 1 minute. Then, Microposit 1813 photoresist was spun over the PMMA layer and baked for 1 minute at 110° C. The 1813 photoresist was patterned using a chromium and glass mask to expose the 1813 photoresist everywhere except in a rectangle covering the transistor area. The PMMA was removed where it was not covered by 1813 photoresist using an oxygen plasma etch for 6 minutes. The sample was then etched in dilute acetic acid to remove AZO and ZnO in the same step. The photoresist was then stripped to make measurements with probes easier.

Testing of the transistors was accomplished by using a probe station to contact the AZO of the first and second electrode at the level of the substrate as the source and drain, thereby testing the two transistors formed on either side of the conductive gate structure in series. This is equivalent to measuring transistor 100 and transistor 200 of FIGS. 1a and 1b in series. The conductive gate stack was contact using the probe station and used to gate the transistors. Referring to FIG. 32, a graph showing performance $I_{ds}$-$V_{ds}$ curve characteristics for the paired transistor of the invention with a channel width of 200 micrometers is shown. Curves corresponding to gate voltages of 0.75, 1.5, 2.25 and 3.0 volts can be seen. As can be seen in FIG. 32, the drain current versus drain voltage is very responsive to the gate voltage. The electrodes, though deposited in one step, are not connected to each other, but function as distinct source and drain electrodes. Referring to FIG. 33, a graph showing $I_{ds}$-$V_g$ performance for 0.2 and 3.0 volts on the drain electrode is shown for the same device. As can be seen in FIG. 33, the drain current responds well to the gate voltage, ranging from a small current of about $10^{-11}$ amps at a gate voltage of about 0 volts to greater than $10^{-5}$ amps at a gate and drain voltage of 3 volts.

The invention has been described in detail with particular reference to certain preferred embodiments thereof, but it will be understood that variations and modifications can be effected within the scope of the invention.

PARTS LIST 20 polymer post
30 inorganic material cap
31 patterned inorganic material layer
40 side wall
41 deposition inhibitor material
45 height of post
25 width of post
35 length of post
50 structural polymer layer
57 inorganic thin film layer
60 optical mask
62 open areas
64 dark areas
100 transistor
102 transistor
103 transistor
121 gate layer
200 transistor
202 transistor
203 transistor
110 substrate
115 thick conductive material layer
120 electrically conductive gate structure
140 first reentrant profile
145 second reentrant profile
150 insulating material layer
160 semiconductor material layer
170 first electrode
175 second electrode
180 third electrode
220 electrically conductive gate structure
240 first reentrant profile
245 second reentrant profile
250 insulating material layer
260 semiconductor material layer
240 first reentrant profile
245 second reentrant profile
270 first electrode
275 second electrode
280 third electrode
340 first reentrant profile
345 second reentrant profile
350 insulating material layer
370 first electrode
375 second electrode
380 third electrode
385 fourth electrode
450 prior art insulating material layer
460 prior art semiconductor material layer
470 prior art first electrode
475 prior art second electrode
480 prior art third electrode
500$a,b,c$ width of top
505$a,b,c$ minimum width defining reentrant profile
530$a,b,c$ height of gate structure 120
535$a,b,c$ top electrically conductive gate structure
510$a,b,c$ first side
520$a,b,c$ second side
540$a,b,c$ first reentrant profile
545$a,b,c$ second reentrant profile
710 providing a substrate
720 providing a gate structure
730 forming a conformal insulating layer
740 forming a conformal semiconductor layer
750 filling the reentrant profile with inhibitor
760 removing a portion of the inhibitor
770 depositing a patterned conductive material
780 optionally removing the inhibitor
860 printing an inhibitor that wicks into the reentrant profile
870 depositing a conductive material
880 optionally removing the inhibitor
900 providing a thick conductive layer
910 forming a patterned inorganic thin film
920 etching the thick conductive layer
950 providing a structural polymer layer
960 forming a patterned inorganic thin film
970 etching the structural polymer layer
980 providing a patterned conformal conductive layer
A,A' cross section line
C1,C1' line first transistor
C2,C2' line second transistor
P,P' line defining reentrant profile

The invention claimed is:

1. A method of producing a vertical transistor comprising:
providing a conductive gate structure having a reentrant profile on a substrate;
forming a conformal insulating material layer on the conductive gate structure;
forming a conformal semiconductor material layer on the insulating material layer;
depositing a deposition inhibiting material over a portion of the substrate and the conductive gate structure including filling the reentrant profile;
removing a portion of the deposition inhibiting material without removing all of the deposition inhibiting material from the reentrant profile; and
forming a plurality of electrodes by depositing an electrically conductive material layer on portions of the semiconductor material layer using a selective area deposition process in which the electrically conductive material layer is not deposited on the deposition inhibiting material remaining in the reentrant profile.

2. The method of claim 1, wherein the selective area deposition process is a conformal deposition process.

3. The method of claim 2, wherein the conformal deposition process is an atomic layer deposition process.

4. The method of claim 2, wherein the conformal deposition process is a spatial atomic layer deposition process.

5. The method of claim 1, wherein the reentrant profile protects the deposition inhibiting material during a deposition inhibiting material removal process that includes exposing and developing a photo-sensitive deposition inhibiting material.

6. The method of claim 1, wherein the reentrant profile protects the deposition inhibiting material during a deposition inhibiting material removal process that includes directionally etching the deposition inhibiting material.

7. The method of claim 6, wherein the directionally etching the deposition inhibiting material includes using an anisotropic plasma etching process.

8. The method of claim 1, wherein depositing the deposition inhibiting material over the portion of the substrate and the conductive gate structure includes using a coating process.

9. The method of claim 1, further comprising removing the deposition inhibiting material after depositing the electrically conducting material layer over portions of the semiconductor material layer.

10. The method of claim 1, wherein the deposition inhibiting material is a polymer.

11. The method of claim 9, wherein the polymer is polymethyl methacrylate (PMMA).

* * * * *